US010955242B2

(12) United States Patent
Komizo

(10) Patent No.: US 10,955,242 B2
(45) Date of Patent: Mar. 23, 2021

(54) INERTIAL SENSOR, METHOD FOR MANUFACTURING INERTIAL SENSOR, INERTIAL MEASUREMENT UNIT, PORTABLE ELECTRONIC APPARATUS, ELECTRONIC APPARATUS, AND VEHICLE

(71) Applicant: Seiko Epson Corporation, Tokyo (JP)

(72) Inventor: Koichiro Komizo, Suwa (JP)

(73) Assignee: Seiko Epson Corporation

( * ) Notice: Subject to any disclaimer, the term of this patent is extended or adjusted under 35 U.S.C. 154(b) by 148 days.

(21) Appl. No.: 16/197,477

(22) Filed: Nov. 21, 2018

(65) Prior Publication Data
US 2019/0154446 A1    May 23, 2019

(30) Foreign Application Priority Data
Nov. 22, 2017 (JP) .............................. JP2017-224382

(51) Int. Cl.
| | | |
|---|---|---|
| *G01C 19/574* | (2012.01) | |
| *G01C 19/5769* | (2012.01) | |
| *G01C 19/5747* | (2012.01) | |
| *H01L 21/3065* | (2006.01) | |
| *B81C 1/00* | (2006.01) | |
| *B81B 3/00* | (2006.01) | |

(52) U.S. Cl.
CPC .......... *G01C 19/574* (2013.01); *B81B 3/0059* (2013.01); *B81C 1/00619* (2013.01); *G01C 19/5747* (2013.01); *G01C 19/5769* (2013.01); *H01L 21/30655* (2013.01); *B81B 2201/0242* (2013.01); *B81B 2203/0163* (2013.01); *B81B 2203/033* (2013.01); *B81C 2201/0112* (2013.01)

(58) Field of Classification Search
CPC ............. G01C 19/574; G01C 19/5769; G01C 19/5747; G01C 19/5712; G01C 19/5726; G01C 19/5762
See application file for complete search history.

(56) References Cited

U.S. PATENT DOCUMENTS

| | | | |
|---|---|---|---|
| 5,501,893 A | 3/1996 | Laermer et al. | |
| 6,105,428 A * | 8/2000 | Schmiesing | G01P 15/0802 361/283.3 |
| 6,450,033 B1 * | 9/2002 | Ito | B81B 3/0051 73/514.29 |
| 7,213,458 B2 * | 5/2007 | Weber | G01C 19/5719 73/504.12 |
| 8,104,343 B2 * | 1/2012 | Klemetti | G01C 19/5712 73/504.12 |

(Continued)

FOREIGN PATENT DOCUMENTS

| | | |
|---|---|---|
| JP | H07-503815 A | 4/1995 |
| JP | 2009-175079 A | 8/2009 |

(Continued)

*Primary Examiner* — Helen C Kwok
(74) *Attorney, Agent, or Firm* — Harness, Dickey & Pierce, P.L.C.

(57) ABSTRACT

A gyro sensor includes a plurality of beams connected via a turnaround part. A groove is provided on a main surface of at least one beam of the plurality of beams. Wall thicknesses on the main surface of two sidewalls facing each other of the groove in a direction orthogonal to a longitudinal direction of the beam satisfy $0.9 \leq T1/T2 \leq 1.1$, where T1 is the wall thickness of one sidewall and T2 is the wall thickness of the other sidewall.

15 Claims, 18 Drawing Sheets

(56) References Cited

U.S. PATENT DOCUMENTS

| | | | | |
|---|---|---|---|---|
| 9,709,509 B1* | 7/2017 | Yang | ................... | G01C 19/5776 |
| 10,697,773 B2* | 6/2020 | Furuhata | ............. | B60W 10/184 |
| 2001/0025529 A1* | 10/2001 | Murata | ................. | G01P 15/125 |
| | | | | 73/514.16 |
| 2008/0314144 A1* | 12/2008 | Blomqvist | ......... | G01C 19/5726 |
| | | | | 73/504.12 |
| 2014/0208823 A1* | 7/2014 | Trusov | .................... | G01P 21/00 |
| | | | | 73/1.38 |
| 2015/0241215 A1* | 8/2015 | Kim | ........................ | G01P 15/18 |
| | | | | 73/504.12 |
| 2016/0245667 A1* | 8/2016 | Najafi | .................. | G01C 25/005 |
| 2016/0273917 A1* | 9/2016 | Kobayashi | ......... | G01C 19/5712 |
| 2020/0191571 A1* | 6/2020 | Fujiyoshi | ........... | G01C 19/5762 |

FOREIGN PATENT DOCUMENTS

| | | |
|---|---|---|
| JP | 2016-095224 A | 5/2016 |
| JP | 2018-185188 A | 11/2018 |

\* cited by examiner

INERTIAL SENSOR, METHOD FOR MANUFACTURING INERTIAL SENSOR, INERTIAL MEASUREMENT UNIT, PORTABLE ELECTRONIC APPARATUS, ELECTRONIC APPARATUS, AND VEHICLE

CROSS-REFERENCE TO RELATED APPLICATION

This nonprovisional application claims the benefit of Japanese Patent Application No. 2017-224382 filed Nov. 22, 2017, the entire disclosure of which is incorporated herein by reference.

BACKGROUND

1. Technical Field

The present invention relates to a physical quantity sensor, a method for manufacturing a physical quantity sensor, an inertial measurement unit, a portable electronic apparatus, an electronic apparatus, and a vehicle.

2. Related Art

Recently, as an example of a physical quantity sensor, a gyro sensor which uses a gyro sensor element utilizing the silicon MEMS (micro-electromechanical system) technology has been developed. Among physical quantity sensors, the gyro sensor, which detects an angular velocity, is quickly coming into widespread use, for example, for the motion sensing function of a game machine or the like.

As such a gyro sensor, for example, JP-A-2009-175079 discloses a sensor element that forms an angular velocity sensor. The sensor element has a support substrate, a fixed part fixed to the support substrate, a vibrator supported to the fixed part via an elastic beam (support beam), a movable comb-like electrode provided on the vibrator, and a fixed comb-like electrode meshing with the movable electrode with a space between them. In the angular velocity sensor of such a configuration, a voltage applied to the fixed comb-like electrode generates an electrostatic force between the movable electrode and the fixed comb-like electrode and this electrostatic force causes the vibrator to vibrate in direction of an X-axis (drive detection). An angular velocity about a Z-axis (or Y-axis) acting on the vibrator in such a vibrating state generates a Coriolis force and this Coriolis force causes the vibrator to vibrate in the direction of the Y-axis (or Z-axis) (detection vibration). Detecting an electrical signal corresponding to the magnitude of the vibration amplitude in the Y-axis (or Z-axis) direction of the vibrator due to the Coriolis force enables detection of the angular velocity of rotation.

Such a sensor element can be manufactured by dry etching. For example, JP-T-7-503815 discloses a so-called Bosch process, which is a Si deep reactive ion etching technique in which an etching step and a sidewall protection film deposition step are repeated, alternately switching between the two types of reactive plasma gases of SF6 (etching gas) and C4F8 (deposition gas).

However, if the sensor element described in JP-A-2009-175079 is to be manufactured by the dry etching technique described in JP-T-7-503815, the etching gas may not become incident perpendicularly on the silicon wafer because of the density distribution of the etching gas, and the processed wall may be processed at an angle that is different from ideal perpendicularity because of the angle of incidence of the etching gas. In this way, while the cross-sectional shape of the sensor element and particularly the cross-sectional shape of the elastic beam (support beam) should ideally be, for example, rectangular, the resulting cross-sectional shape is a parallelogram, trapezoid or the like due to the processing error. Therefore, the drive vibration of the vibrator includes not only a vibration component in the X-axis direction, which is the desired direction of drive vibration, but also a vibration component in the Y-axis direction or Z-axis direction. Thus, a quadrature signal, which is a type of unwanted signal, increases, affecting the detection signal. This poses a problem in that the detection accuracy drops.

SUMMARY

An advantage of some aspects of the invention is to solve at least a part of the problems described above, and the invention can be implemented as the following configurations or application examples.

Application Example 1

A physical quantity sensor according to this application example includes a plurality of beams connected via a turnaround part. A groove is provided on a main surface of at least one beam of the plurality of beams. Wall thicknesses on the main surface of two sidewalls facing each other of the groove in a direction orthogonal to a longitudinal direction of the beam satisfy $0.9 \leq T1/T2 \leq 1.1$, where T1 is the wall thickness of one sidewall and T2 is the wall thickness of the other sidewall.

In the physical quantity sensor according to this application example, even if the plurality of beams connected via the turnaround part has an asymmetrical cross-sectional shape (for example, a parallelogram or trapezoid as a non-rectangular shape), a groove that satisfies $0.9 \leq T1/T2 \leq 1.1$, where the wall thickness T1 of one sidewall and the wall thickness T2 of the other sidewall are stable, is formed on the main surface of at least one beam of the plurality of beams. With this configuration, an increase of a quadrature signal, which is a type of unwanted signal, can be stably reduced. Thus, a drop in detection accuracy can be reduced.

Application Example 2

In the physical quantity sensor described in the above application example, it is preferable that the groove is provided at a center part in the longitudinal direction of the beam.

In this application example, the groove is provided at a center part in the longitudinal direction of the beam. This improves balance in the longitudinal direction of the beam and thus can reduce the quadrature signal more significantly.

Application Example 3

In the physical quantity sensor described in the above application example, it is preferable that the sidewalls have a surface in a recessed shape on the main surface side, when viewed in a plan view from a direction orthogonal to the longitudinal direction.

With this application example, the quadrature signal can also be reduced by the recessed shape provided on the surface on the main surface side, of the sidewalls. Thus, the length in the longitudinal direction of the groove can be shortened and a drop in the strength of the beam can be reduced.

Application Example 4

In the physical quantity sensor described in the above application example, it is preferable that the recessed shape is curved.

In this application example, the recessed shape provided on the surface on the main surface side, of the sidewalls, is curved. This can increase the strength (rigidity) of the beam against a bending force in the longitudinal direction.

Application Example 5

In the physical quantity sensor described in the above application example, it is preferable that the wall thicknesses T1 and T2 satisfy 0.05 µm≤T1≤0.5 µm and 0.05 µm≤T2≤0.5 µm.

With this application example, the beam can be formed without reducing the strength (rigidity) of the part where the groove is formed.

Application Example 6

In the physical quantity sensor described in the above application example, it is preferable that the plurality of beams is provided in a sensor element and that the sensor element is an angular velocity sensor element that can detect an angular velocity.

This application example can provide an angular velocity sensor in which an increase of a quadrature signal is reduced.

Application Example 7

An inertial measurement unit according to this application example includes: the physical quantity sensor described in the above Application Example 6; an acceleration sensor; and a control unit which controls the physical quantity sensor and the acceleration sensor.

In the inertial measurement unit according to this application example, the control unit controls the physical quantity sensor (angular velocity sensor), in which an increase of a quadrature signal is reduced, and the acceleration sensor. Thus, an inertial measurement unit that can output highly reliable physical quantity data can be provided.

Application Example 8

A portable electronic apparatus according to this application example includes: the physical quantity sensor described in one of the above application examples; a case which accommodates the physical quantity sensor; a processing unit which is accommodated in the case and processes output data from the physical quantity sensor; a display unit accommodated in the case; and a light-transmissive cover which closes an opening of the case.

In the portable electronic apparatus according to this application example, the processing unit performs control based on output data outputted from the physical quantity sensor. Thus, a highly reliable portable electronic apparatus that can achieve the effects of the physical quantity sensor can be provided.

Application Example 9

It is preferable that the portable electronic apparatus described in the above application example includes a satellite positioning system and thus measures a moving distance or a trajectory of movement of a user.

This application example can provide a highly reliable portable electronic apparatus that can measure the moving distance or the trajectory of movement of the user via the satellite positioning system.

Application Example 10

An electronic apparatus according to this application example includes: the physical quantity sensor described in one of the above application examples; and a control unit which performs control based on a detection signal outputted from the physical quantity sensor.

In the electronic apparatus according to this application example, the control unit performs control based on a detection signal outputted from the physical quantity sensor. Thus, a highly reliable electronic apparatus that can achieve the effects of the physical quantity sensor can be provided.

Application Example 11

A vehicle according to this application example includes: the physical quantity sensor described in one of the above application examples; and an attitude control unit which controls an attitude, based on a detection signal outputted from the physical quantity sensor.

In the vehicle according to this application example, the attitude control unit controls the attitude, based on a detection signal outputted from the physical quantity sensor. Thus, a highly reliable vehicle that can achieve the effects of the physical quantity sensor can be provided.

Application Example 12

It is preferable that the vehicle described in the above application example includes at least one system from among an engine system, a braking system, and a keyless entry system, and that the attitude control unit controls the system, based on the detection signal.

In this application example, the attitude control unit controls at least one system from among an engine system, a braking system, and a keyless entry system, based on a detection signal outputted from the physical quantity sensor. Thus, a highly reliable vehicle that can achieve the effects of the physical quantity sensor can be provided.

Application Example 13

A method for manufacturing a physical quantity sensor according to this application example is a method for manufacturing a physical quantity sensor in which a plurality of sensor elements is arranged on a wafer, each sensor element including a plurality of beams connected via a turnaround part, with a groove provided on a main surface of at least one beam of the plurality of beams. The method includes: deciding at least one of a number of the beams where the groove is to be formed and a length in a longitudinal direction of the groove, according to distribution of the sensor elements arranged within a surface of the wafer; and forming the groove in the beam, based on the decision.

In the method for manufacturing the physical quantity sensor according to this application example, at least one of the number of beams where the groove is to be formed and the length in the longitudinal direction of the groove is decided according to the distribution of the sensor elements arranged within the plane of the wafer, and the groove is formed in the beam, based on the decision. Thus, a physical quantity sensor in which irregular occurrence of a quadrature signal within the surface of the wafer is reduced can be manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a physical quantity sensor, a method for manufacturing a physical quantity sensor, an inertial measurement unit, a portable electronic apparatus, an electronic apparatus, and a vehicle according to the invention will be described in detail, based on embodiments illustrated in the accompanying drawings.

Figure 1:
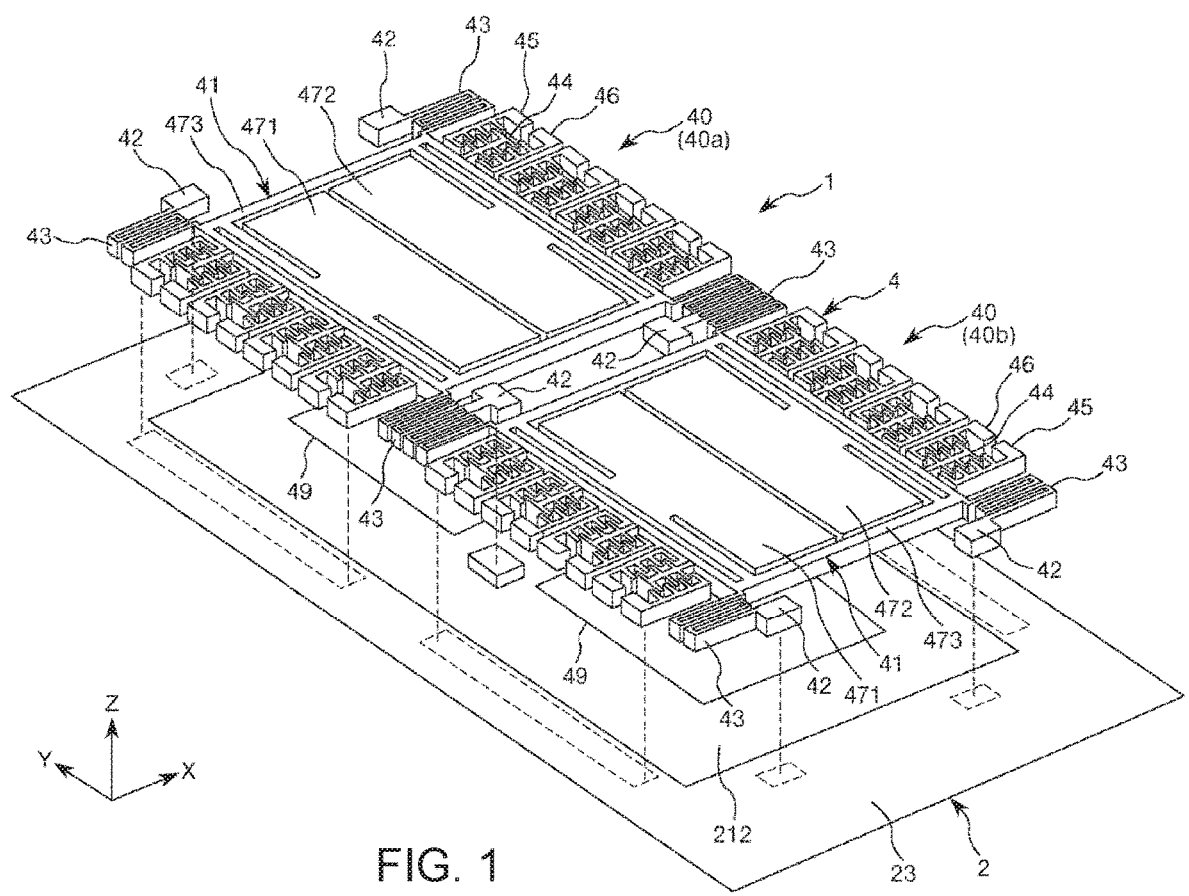
FIG. 1 is a perspective view showing a schematic configuration of a gyro sensor (angular velocity sensor) according to an embodiment of a physical quantity sensor.
Figure 2:
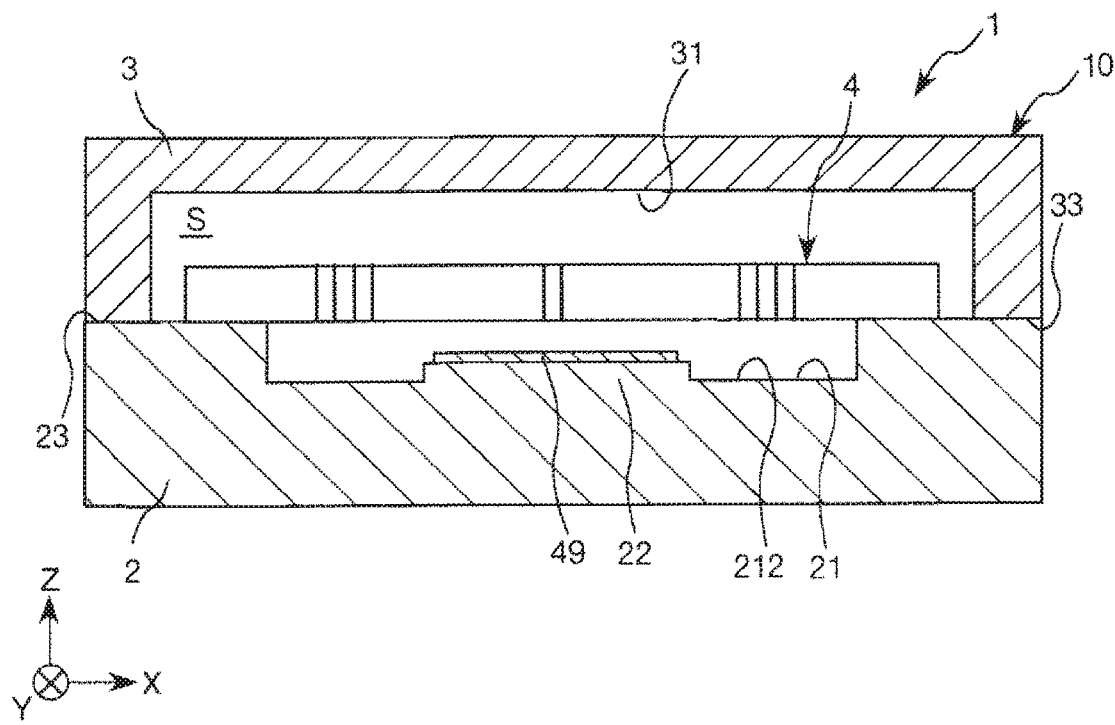
FIG. 2 is a cross-sectional view showing a schematic configuration of the gyro sensor shown in FIG. 1.
Figure 3:
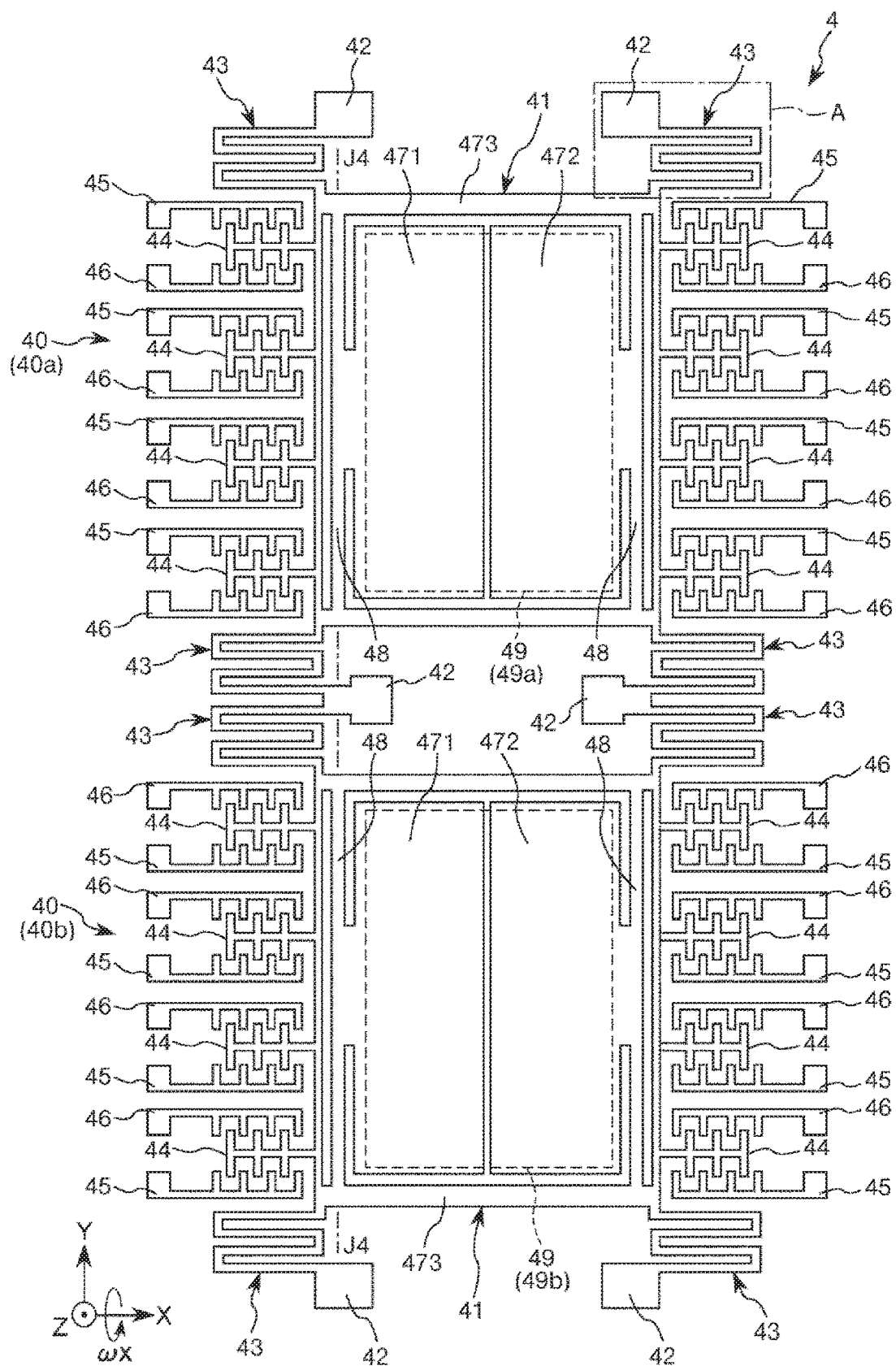
FIG. 3 is a plan view schematically showing a gyro sensor element shown in FIG. 1.

1. Physical Quantity Sensor and Method for Manufacturing Physical Quantity Sensor Embodiments First, as an embodiment of the physical quantity sensor, a gyro sensor (angular velocity sensor) is described with reference to FIGS. 1, 2, and 3. FIG. 1 is a perspective view showing a schematic configuration of a gyro sensor (angular velocity sensor) according to an embodiment of the physical quantity sensor. FIG. 2 is a cross-sectional view showing a schematic configuration of the gyro sensor shown in FIG. 1. FIG. 3 is a plan view schematically showing a gyro sensor element shown in FIG. 1. FIG. 1 schematically shows a substrate (base) and does not show a lid. In the description below, an X-axis (third axis), a Y-axis (first axis), and a Z-axis (second axis) are provided as three axes orthogonal to each other. A direction along the X-axis is also referred to as "X-axis direction". A direction along the Y-axis is also referred to as "Y-axis direction". A direction along the Z-axis is also referred to as "Z-axis direction". The Z-axis is an axis indicating a direction of thickness in which the substrate and the lid come on top of each other. The X-axis is an axis along the driving direction of the gyro sensor element. Also, for the sake of convenience of the description, when viewed in a plan view from the Z-axis direction, the +Z-axis direction side, which is the lid side, may be referred to as "up" and a surface on the +Z-axis direction side may be referred to as "upper surface". The −Z-axis direction side, which is opposite to the above, may be referred to as "down" and a surface on the −Z-axis direction side may be referred to as "lower surface". In the illustrations, for the sake of convenience of the description, the dimension of each part is exaggerated to a certain extent according to need. The dimension ratios between respective parts in the illustrations may not necessarily coincide with the actual dimension ratios of these parts.

Gyro Sensor

As shown in FIG. 1, a gyro sensor 1 according to the embodiment of the physical quantity sensor is an angular velocity sensor that can detect an angular velocity about the X-axis. This gyro sensor 1 has a gyro sensor element (angular velocity sensor element) 4 as a sensor element, and a package 10 accommodating the gyro sensor element 4, as shown in FIG. 2.

Package

The package 10 has a substrate 2 (base) supporting the gyro sensor element 4, and a lid 3 bonded to the substrate 2. Between the substrate 2 and the lid 3, a space S accommodating the gyro sensor element 4 is formed. Each of the substrate 2 and the lid 3 is in the shape of a plate and arranged along an XY plane (reference plane), which is a plane including the X-axis and the Y-axis.

The substrate 2 is provided with a recessed part 21 opening upward (to the side of the gyro sensor element 4).

At a center part of the recessed part 21, a protruding part 22 protruding from a bottom surface 212 of the recessed part 21 is provided. On an upper surface 23 excluding the recessed part 21 of the substrate 2, a part of the gyro sensor element 4 (fixed part 42 and fixed drive parts 45, 46, described later) is fixed.

The lid 3 is provided with a recessed part 31 opening downward (to the side of the substrate 2). The lid 3 is provided on the substrate 2 in such as way as to cover the gyro sensor element 4 in a contactless manner. A lower surface 33 of the lid 3 excluding the recessed part 31 is bonded to the upper surface 23 of the substrate 2.

The space S functioning as a cavity is an airtight space formed by the recessed part 21 and the recessed part and is in a pressure-reduced state (for example, approximately $1 \times 10^2$ to $1 \times 10^{-2}$ Pa). Thus, the detection sensitivity for angular velocity can be improved.

Although the material forming the substrate 2 is not particularly limited, it is preferable to use an insulative material. Specifically, a high-resistance silicon material or glass material is preferable. For example, a glass material containing a predetermined amount of alkali metal ions (mobile ions) (for example, borosilicate glass such as Pyrex (trademark registered) glass) is preferable. Thus, even if the gyro sensor element 4 is mainly made of silicon, the substrate 2 and the gyro sensor element 4 can be anodically bonded together. Also, a quartz substrate, quartz crystal substrate, or SOI (silicon-on-insulator) substrate may be employed.

The material forming the lid 3 is not particularly limited. For example, a material similar to that of the substrate 2 can be used.

The method for bonding the substrate 2 and the lid 3 is not particularly limited and may vary depending on the materials forming the substrate 2 and the lid 3. As the method for bonding the substrate 2 and the lid 3, for example, a bonding method using a bonding material such as an adhesive or brazing material, a direct bonding method, or a solid bonding method such as anodic bonding can be used.

Gyro Sensor Element

As shown in FIG. 3, the gyro sensor element (angular velocity sensor element) 4 as a sensor element has two structures 40 (40a, 40b) arranged next to each other in the Y-axis direction, and two fixed detection units 49 (49a, 49b). The two structures 40a, 40b form vertical symmetry in the + (positive) Y-axis direction and the − (negative) Y-axis direction in FIG. 3 and have similar configurations.

Each of the structures 40a, 40b has a mass part 41, a plurality of fixed parts 42, a plurality of elastic parts 43, a plurality of drive parts 44 (movable drive electrodes), a plurality of fixed drive parts 45, 46 (fixed drive electrodes), detection parts 471, 472 (movable detection electrodes), and a plurality of beam support beams 48. The mass part 41 includes the drive parts 44, a frame 473, the detection parts 471, 472, and the beam support beams 48, which are integrally formed. That is, the detection parts 471, 472 have a shape that is included in the mass part 41.

The outer shape of the mass part 41 is a quadrilateral frame-like shape, when viewed in a plan view seen from the Z-axis direction (hereinafter simply referred to as "when viewed in a plan view"), and includes the drive parts 44, the frame 473, and the detection parts 471, 472, as described above. Specifically, the outer shape of the mass part 41 is formed by a pair of parts extending in the Y-axis direction and parallel to each other, and a pair of parts connecting end parts of the former pair of parts and extending in the X-axis direction and parallel to each other.

As the fixed parts 42, four fixed parts 42 are provided for one structure 40. Each fixed part 42 is fixed to the upper surface 23 of the substrate 2. Each fixed part is arranged on the outside of the mass part 41, when viewed in a plan view. In this embodiment, each fixed part 42 is arranged at a position corresponding to each corner of the mass part 41. In the illustration, the fixed part 42 situated on the −Y-axis side in the structure 40a and the fixed part 42 situated on the +Y-axis side in the structure 40b are the same fixed part.

As the elastic parts 43, four elastic parts 43 are provided for one structure 40 in this embodiment. The respective elastic parts 43 connect a part of the mass part 41 to the fixed parts 42, when viewed in a plan view. In this embodiment, the elastic parts 43 are connected to the corners of the frame 473 of the mass part 41. However, this is not limiting. The elastic parts 43 may be connected to any positions where the elastic parts 43 can displace the mass part 41 with respect to the fixed parts 42. In FIG. 3, the elastic parts 43 are configured to be able to displace the mass part 41 in the Y-axis direction. Each elastic part 43 has a square wave-like shape, when viewed in a plan view, and has first parts 4301 as a plurality of beams extending in the X-axis direction, and second parts 4302 forming turnaround parts 430 and extending in the Y-axis direction (see FIG. 4). The shape of each drive part 44 is not limited to the illustrated shape, provided that the drive part 44 can be elastically deformed in a desired drive direction (in this embodiment, the Y-axis direction).

As the drive parts 44, eight drive parts 44 are provided for one structure 40. Each drive part 44 is connected to a part extending in the Y-axis direction of the mass part 41. Specifically, four drive parts 44 are situated on the +X side of the mass part 41 and the remaining four drive parts 44 are situated on the −X side of the mass part 41. Each drive part 44 has a comb-like shape having a trunk part extending in the X-axis direction from the mass part 41 and a plurality of branch parts extending in the Y-axis direction from the trunk part.

As the fixed drive parts 45, 46, eight fixed drive parts 45 and eight fixed drive parts 46 are provided for one structure 40. The fixed drive parts 45, 46 are fixed to the upper surface 23 of the substrate 2. The respective fixed drive parts 45, 46 have a comb-like shape corresponding to the drive parts 44 and provided on both sides of the drive parts 44.

Each of the detection parts 471, 472 is a plate-like member which is quadrilateral when viewed in a plan view. The detection parts 471, 472 are arranged on the inner side of the mass part 41 and connected to the mass part 41 via the beam support beams 48. Each of the detection parts 471, 472 can pivotally turn (be displaced) about a pivotal axis J4.

The fixed detection units 49 (fixed detection electrodes) are provided on the protruding part 22 situated inside the recessed part 21 of the substrate 2 (see FIG. 2). Each of the fixed detection units 49 is quadrilateral when viewed in a plan view and faces the detection parts 471, 472. The fixed detection units 49 are spaced apart from the detection parts 471, 472.

The mass part 41, the elastic parts 43, the drive parts 44, a part of the fixed drive parts 45, a part of the fixed drive parts 46, the detection parts 471, 472, and the beam support beams 48 of the above configuration are provided above the recessed part 21 of the substrate 2 and spaced apart from the substrate 2.

The structure 40 as described above is formed altogether by patterning an electrically conductive silicon substrate doped with an impurity such as phosphorus or boron, for example, using the Bosch process, in which an etching process with a reactive plasma gas and a deposition process are combined.

As the material forming the fixed detection parts 49, for example, aluminum, gold, platinum, ITO (indium tin oxide), ZnO (zinc oxide) or the like can be used.

Although not illustrated, each of the fixed parts 42, the fixed drive parts 45, the fixed drive parts 46, the fixed detection unit 49a, and the fixed detection unit 49b is electrically connected to a wiring and a terminal, not illustrated. The wirings and terminals are provided, for example, on the substrate 2.

The configuration of the gyro sensor 1 has been briefly described. The gyro sensor 1 of such a configuration can detect an angular velocity wx in the following manner.

First, a drive voltage applied between the drive parts 44 and the fixed drive parts 45, 46 provided in the gyro sensor 1 generates an electrostatic attraction force that periodically changes in intensity, between the fixed drive parts 45, 46 and the drive parts 44. Thus, each drive part 44 vibrates in the Y-axis direction, accompanying elastic deformation of each elastic part 43. At this time, the plurality of drive parts 44 provided in the structure 40a and the plurality of drive parts 44 provided in the structure 40b vibrate in the opposite phases to each other in the Y-axis direction (drive vibration).

An angular velocity ωx applied to the gyro sensor 1 in the state where the drive parts 44 are thus vibrating in the Y-axis direction causes a Coriolis force to act, displacing the detection parts 471, 472 about the pivotal axis J4. At this time, the detection parts 471, 472 provided in the structure 40a and the detection parts 471, 472 provided in the structure 40b are displaced in the opposite directions to each other. For example, when each of the detection parts 471, 472 provided in the structure 40a is displaced in the +Z-axis direction, each of the detection parts 471, 472 provided in the structure 40b is displaced in the −Z-axis direction. Meanwhile, when each of the detection parts 471, 472 provided in the structure 40a is displaced in the −Z-axis direction, each of the detection parts 471, 472 provided in the structure 40b is displaced in the +Z-axis direction.

Such displacement (detection vibration) of the detection parts 471, 472 changes the distance between the detection parts 471, 472 and the fixed detection units 49. With this change of the distance, the electrostatic capacitance between the detection parts 471, 472 and the fixed detection units 49 changes. Based on the amount of change of the electrostatic capacitance, the angular velocity ωx applied to the gyro sensor 1 can be detected.

As described above, when the drive parts 44 vibrate in the Y-axis direction (drive vibration), ideally, it is preferable the drive parts 44 vibrate substantially parallel to the Y-axis direction from a non-driven state. However, due to a processing error or the like, the shape of the gyro sensor element 4 and particularly the shape of elastic parts 43 may not have an ideal rectangular shape. Therefore, the vibration of the drive parts 44 connected to the elastic parts 43 via the mass part 41 may include not only a vibration component in the Y-axis direction, which is the desired direction of drive vibration, but also a vibration component (unwanted vibration component) in the X-axis direction or the Z-axis direction, which is not the desired direction of drive vibration. That is, a so-called quadrature signal may increase.

In this embodiment, the elastic parts 43 are characterized in such a way as to be able to reduce an increase in the quadrature signal. The elastic parts 43 will be described in detail below with reference to FIGS. 4, 5, 6, 7, and 8.

Elastic Parts

Figure 4:
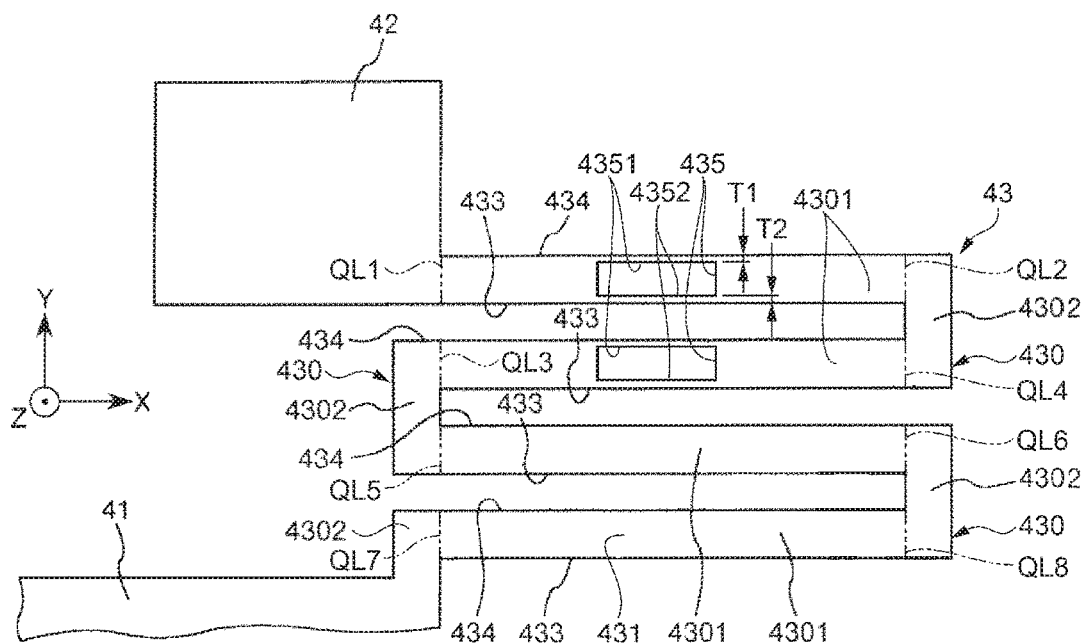
FIG. 4 is a plan view schematically showing a part of elastic parts shown in FIG. 3.
Figure 5:
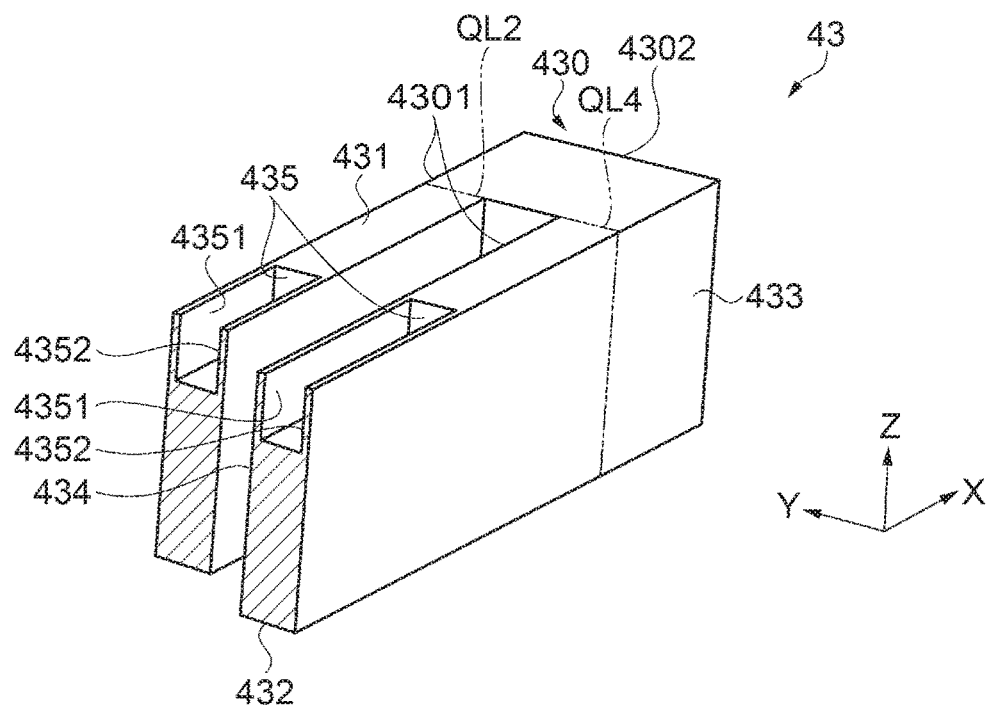
FIG. 5 is a perspective cross-sectional view schematically showing a part of the elastic part shown in FIG. 4.
Figure 6:
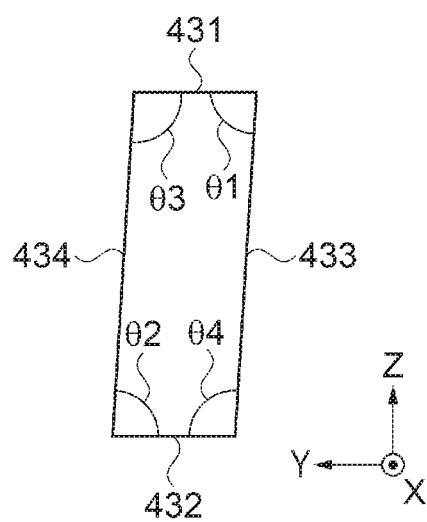
FIG. 6 is a lateral cross-sectional view of beams forming the elastic part shown in FIG. 4.
Figure 7:
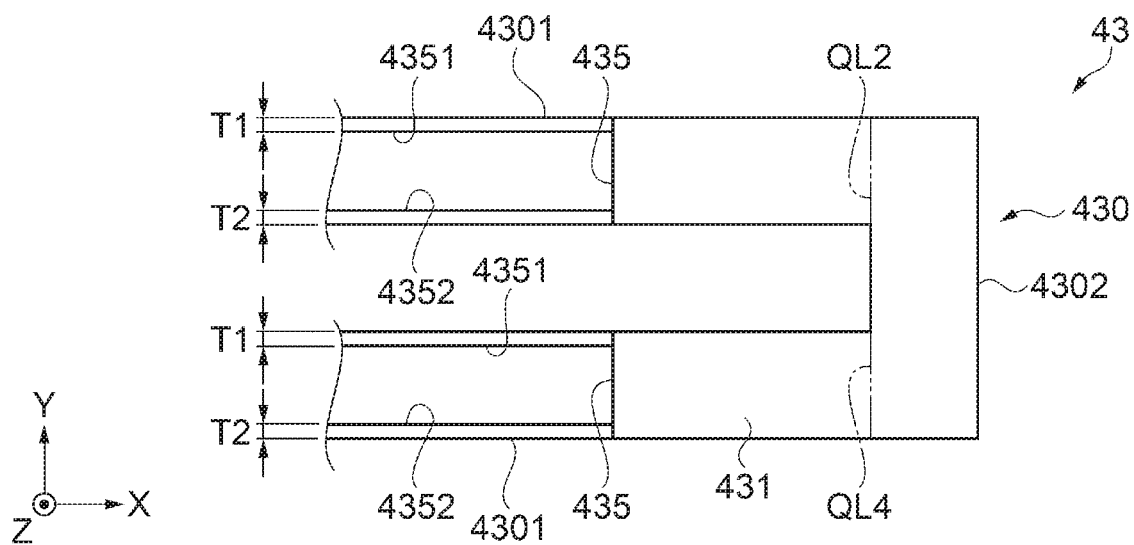
FIG. 7 is a plan view showing grooves provided in the beams forming the elastic part.
Figure 8:
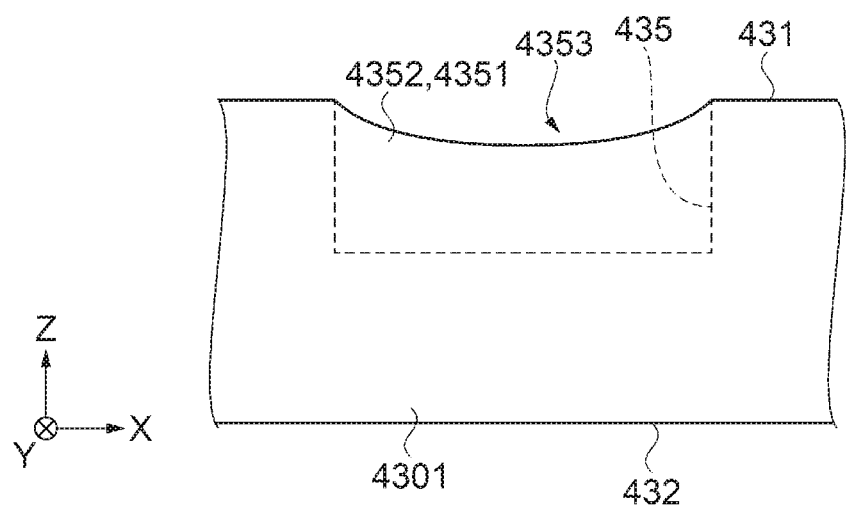
FIG. 8 is a side view showing the sidewall shape of the grooves shown in FIG. 7.

FIG. 4 is a plan view schematically showing a part of the elastic parts shown in FIG. 3. FIG. 5 is a perspective cross-sectional view schematically showing a part of the elastic part shown in FIG. 4. FIG. 6 is a lateral cross-sectional view of beams forming the elastic part shown in FIG. 4. FIG. 7 is a plan view showing grooves formed in the beams forming the elastic part. FIG. 8 is a side view showing the sidewall shape of the grooves shown in FIG. 7. In FIG. 4, the elastic part 43 in an area A surrounded by a dash-dotted line in FIG. 3 is illustrated as a representative.

As shown in FIG. 4, the elastic part 43 has a square wave-like shape, when viewed in a plan view, and has elongate first parts 4301 as a plurality of beams extending along the X-axis direction (longitudinal direction), a plurality of second parts 4302 extending along the Y-axis direction (short-side direction), and grooves 435 provided along the X-axis direction (longitudinal direction) in the first parts 4301. The first parts 4301 are longer than the second parts 4302. The first parts 4301 are the parts marked off by imaginary lines QL1, QL2, QL3, QL4, QL5, QL6, QL7, and QL8 shown in the illustration, as approximate boundaries. The second parts 4302 form so-called turnaround parts 430, each of which connects one first part 4301 and the next first part 4301 to form a turnaround. The plurality of first parts 4301 are turned around at the turnaround parts 430 including the second parts 4302 and thus have a square wave-like shape. The elastic part 43 has its one end connected to an end part of the mass part 41 indicated by the imaginary line QL7 in the illustration and has its other end connected to an end part of the fixed part 42 indicated by the imaginary line QL1 in the illustration.

As shown in FIGS. 5 and 6, the cross-sectional shape of the elastic part 43 when viewed from a direction along the X-axis direction (lateral cross-sectional shape parallel to the YZ plane, which is a plane including the Y-axis and the Z-axis) is substantially parallelogram-like. The outer peripheral surface of the elastic part 43 includes a first main surface 431 and a second main surface 432 as a pair of main surfaces, and a first lateral surface 433 and a second lateral surface 434 as a pair of lateral surfaces.

Each of the first main surface 431 and the second main surface 432 is a flat surface along the XY plane, which is a plane including the X-axis and the Y-axis. The first main surface 431 is a surface on the +Z-axis side (upper surface). The second main surface 432 is a surface on the −Z-axis side (lower surface). In this embodiment, each of the first main surface 431 and the second main surface 432 has a square wave-like shape and has parts extending along the X-axis direction and parts extending along the Y-axis direction.

The first lateral surface 433 is a surface on the −Y-axis side. The second lateral surface 434 is a surface on the +Y-axis side. In this embodiment, four first lateral surfaces 433 and four second lateral surfaces 434 are provided in one elastic part 43 (see FIG. 4). As shown in FIGS. 5 and 6, each of the first lateral surface 433 and the second lateral surface 434 is a flat surface tilting with respect to the XZ plane, which is a plane including the X-axis and the Z-axis. Specifically, the angle (tilt angle) formed by the first lateral surface 433 and the XZ plane is deviated from an ideal shape, for example, due to a processing error. This angle, if expressed by θ11, is approximately 0°<θ11<3° (or −3°<θ11<0°). Similarly, the tilt angle of the second lateral surface 434 is approximately −3°<θ11<0° (or 0°<θ11<3°). The side of the first lateral surface 433 on the +Z-axis side is connected to the first main surface 431 and its side on the −Z-axis side is connected to the second main surface 432. Meanwhile, the side of the second lateral surface 434 on the +Z-axis side is connected to the first main surface 431 and its side on the −Z-axis side is connected to the second main surface 432.

The elongate first parts 4301 as a plurality of beams extending along the X-axis direction (longitudinal direction) are formed by the first main surface 431 and the second main surface 432 arranged as described above, and the first lateral surface 433 and the second lateral surface 434 as a pair of lateral surfaces.

The groove 435 is provided on the main surface (first main surface 431 or second main surface 432) of at least one of the plurality of first parts 4301. The groove 435 in this embodiment is provided on the first main surfaces 431 of two first parts 4301. Each of the grooves 435 is situated at a center part in the longitudinal direction (X-axis direction) of the first main surface 431, when each of the first parts 4301 is viewed in a plan view from the Z-axis direction. Each of the grooves 435 is provided as a recessed part with a closed bottom and opening to the first main surface 431 along the X-axis direction. Providing the groove 435 at the center part in the longitudinal direction of the first main surface 431 of the first part 4301 in this manner can improve the balance in the longitudinal direction of the first part 4301 and reduce the quadrature signal more significantly.

On both sides of the groove 435 along the direction (Y-axis direction) orthogonal to the X-axis direction (longitudinal direction) of the first part 4301, two sidewalls 4351, 4352 are provided. The sidewall 4351 and the sidewall 4352 are two wall parts situated in the Y-axis direction of the groove 435 and facing each other.

It is desirable that the two sidewalls 4351, 4352 are provided in such a way as to satisfy $0.9 \leq T1/T2 \leq 1.1$, where T1 is the wall thickness (thickness in the Y-axis direction) of one sidewall on the first main surface 431 and T2 is the wall thickness (thickness in the Y-axis direction) of the other sidewall, as shown in FIG. 7. It is also desirable that the two sidewalls 4351, 4352 are provided in such a way that the wall thickness T1 satisfies $0.05\ \mu m \leq T1 \leq 0.5\ \mu m$ and that the wall thickness T2 satisfies $0.05\ \mu m \leq T2 \leq 0.5\ \mu m$. Forming the wall thicknesses T1, T2 of the two sidewalls 4351, 4352 in this manner enables forming the sidewalls 4351, 4352 that can maintain stable strength (rigidity) without reducing thickness balance. Thus, the first parts 4301 (beams) provided with the grooves 435 having the two sidewalls 4351, 4352 facing each other can be formed stably.

Also, it is preferable that the surface on the side of the first main surface 431 of the two sidewalls 4351, 4352 has a so-called recessed shape 4353 recessed in a convex form, when viewed in a plan view from the direction (Y-axis direction) orthogonal to the X-axis direction (longitudinal direction), as shown in FIG. 8. The recessed shape 4353 provided on the side of the first main surface 431 of the sidewalls 4351, 4352 can further reduce the quadrature signal. Therefore, the length in the X-axis direction (longitudinal direction) of the grooves 435 can be shortened and a drop in the strength of the first parts 4301 can be reduced.

In this embodiment, the recessed shape 4353 on the side of the first main surface 431 of the two sidewalls 4351, 4352 is curved, as shown in FIG. 8. Curving the recessed shape 4353 on the side of the first main surface 431 in this manner enables increasing strength (rigidity) against a force (bending force) in the X-axis direction (longitudinal direction) of the first parts 4301.

The recessed shape 4353 on the side of the first main surface 431 of the sidewalls 4351, 4352 is not limited to the above configuration and can also be a straight line, a curved line, or a mixture of a straight line and a curved line.

The lateral cross-sectional shape of the elastic part 43 of such a configuration is substantially parallelogram-like, as described above. In this embodiment, an angle $\theta 1$ formed by the first main surface 431 and the first lateral surface 433 is less than 90°. That is, the angle $\theta 1$ is an acute angle. Similarly, an angle $\theta 2$ formed by the second main surface 432 and the second lateral surface 434 is an acute angle. Meanwhile, an angle $\theta 3$ formed by the first main surface 431 and the second lateral surface 434 and an angle $\theta 4$ formed by the second main surface 432 and the first lateral surface 433 are more than 90°. That is, each of the angles $\theta 3$, $\theta 4$ is an obtuse angle.

Now, as described above, the gyro sensor 1 has: the substrate 2; the fixed parts 42 fixed to the substrate 2; the drive parts 44 driven in the first direction along the Y-axis as the "first axis"; the detection parts 471, 472, which can be displaced in the second direction along the Z-axis as the "second axis" orthogonal to the Y-axis by a Coriolis force acting on the drive parts 44; the mass part 41 connecting the drive parts 44 to the fixed parts 42; and the elastic parts 43 connecting the mass part 41 to the fixed parts 42. The outer peripheral surface of the elastic parts 43 includes the first main surface 431 and the second main surface 432 as the "main surface", and the first lateral surface 433 and the second lateral surface 434 as the "lateral surface".

Of the gyro sensor element 4, the elastic parts 43 are parts connected to the fixed parts 42 fixed to the substrate 2. The elastic parts 43 tend to have vibrations including components other than a drive vibration component, by having a shape that is different from an ideal shape, for example, by having a parallelogram-like or trapezoidal shape, due to a processing error. Therefore, providing the grooves 435 on the elastic parts 43 is particularly effective in reducing an increase of the quadrature signal in the gyro sensor 1. This is because the elastic parts 43 decides the direction of drive amplitude and a deviation of the shape of the elastic parts 43 from their ideal shape is a principal factor that causes the quadrature signal. That is, providing the grooves 435 in the first parts 4301 forming the elastic parts 43 as in this embodiment can reduce the vibration component in the Z-axis direction of the elastic parts 43 and is therefore effective in restraining the quadrature signal. Also, changing the length in the X-axis direction (longitudinal direction) of the grooves 435 or changing the number of first parts 4301 where the groove 435 is provided (that is, changing the number of grooves 435) can further reduce the vibration component in the Z-axis direction of the elastic parts 43 (preferably to 0).

This embodiment has the elastic parts 43, which are displaced by the vibration of the drive parts 44, and the beam support beams 48, which are not displaced relatively to the vibration of the drive parts 44 but are displaced according to a Coriolis force. Therefore, there is little influence of the processing of the elastic parts 43 on the beam support beams 48. The beam support beams 48 may be displaceable in the Z-axis direction and may be, for example, torsion springs, folded springs, or leaf springs that are thin in the Z-axis direction.

In the gyro sensor 1 described above, even if the plurality of beams (first parts 4301) connected via the turnaround part 430 have an asymmetrical cross-sectional shape (for example, a parallelogram or trapezoid as a non-rectangular shape), the groove 435 satisfying the following formula is provided and therefore an increase of the quadrature signal, which is a type of unwanted signal, can be stably reduced. Specifically, it is desirable that the groove 435 is provided on the main surface of at least one beam of the plurality of beams (first parts 4301) in such a way as to satisfy $0.9 \leq T1/T2 \leq 1.1$, where the wall thickness T1 of one sidewall and the wall thickness T2 of the other sidewall are stable, and in such a way that the wall thickness T1 and the wall thickness T2 satisfy $0.05 \, \mu m \leq T1 \leq 0.5 \, \mu m$ and $0.05 \, \mu m \leq T2 \leq 0.5 \, \mu m$. As a result, an increase of the quadrature signal, which is a type of unwanted signal, can be stably reduced. Thus, a drop in the detection accuracy of the gyro sensor 1 can be reduced.

Method for Manufacturing Gyro Sensor

Next, a method for manufacturing a gyro sensor will be described with reference to FIG. 9 and FIGS. 10 to 17. In the description below, an example of manufacturing the gyro sensor 1 will be described.

Figure 9:
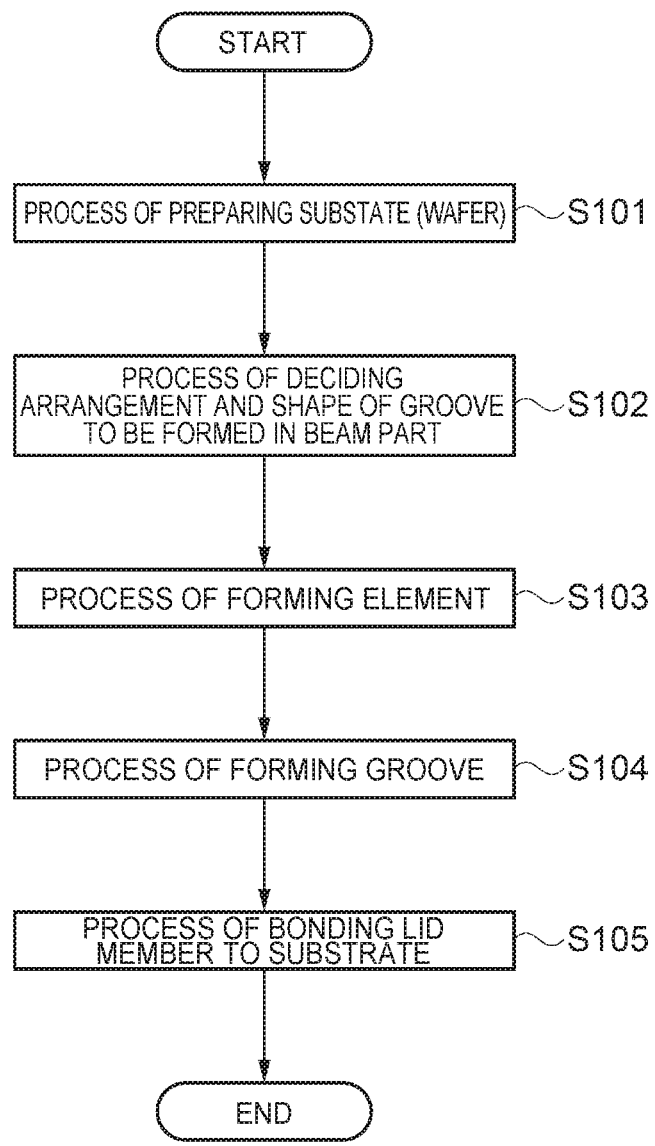
FIG. 9 is a flowchart showing processes in a method for manufacturing the gyro sensor (angular velocity sensor) according to the first embodiment.
Figure 10:
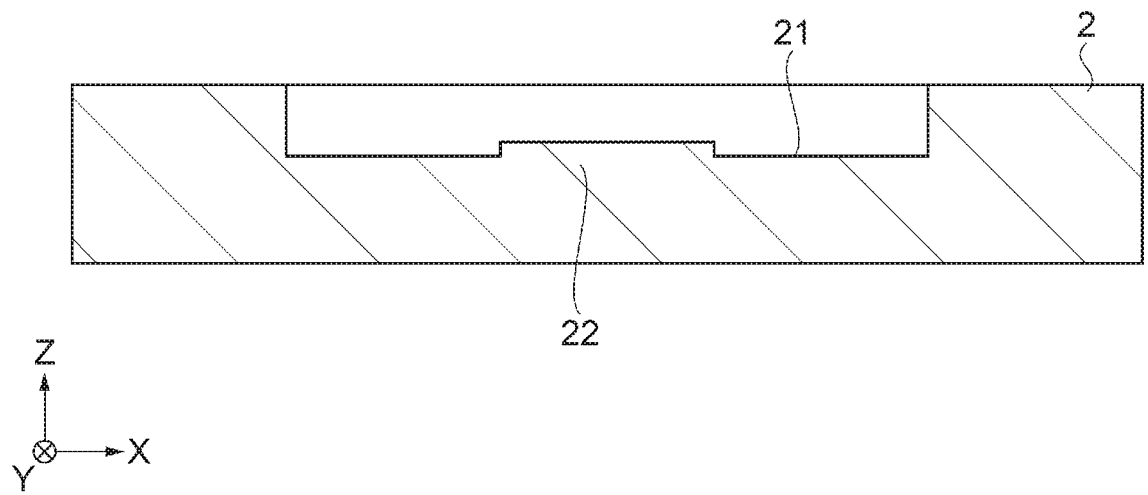
FIG. 10 is a process view for explaining a procedure of preparing a substrate.
Figure 11:
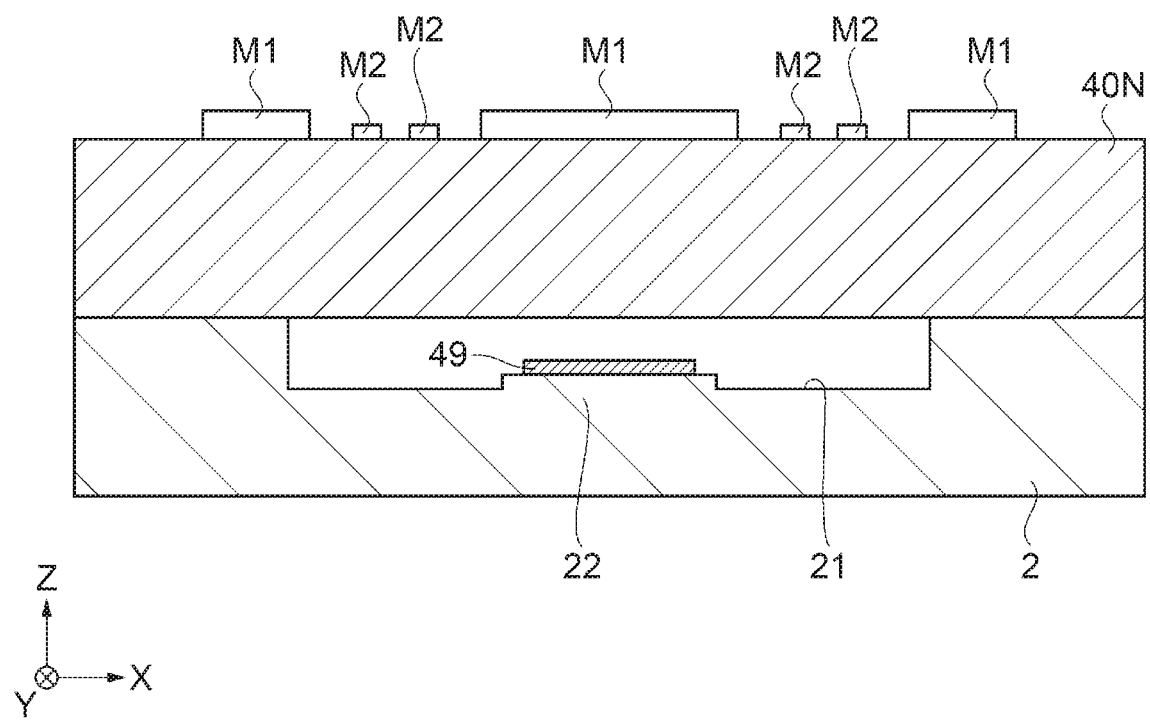
FIG. 11 is a process view for explaining a procedure 1 of forming a gyro element.
Figure 12:
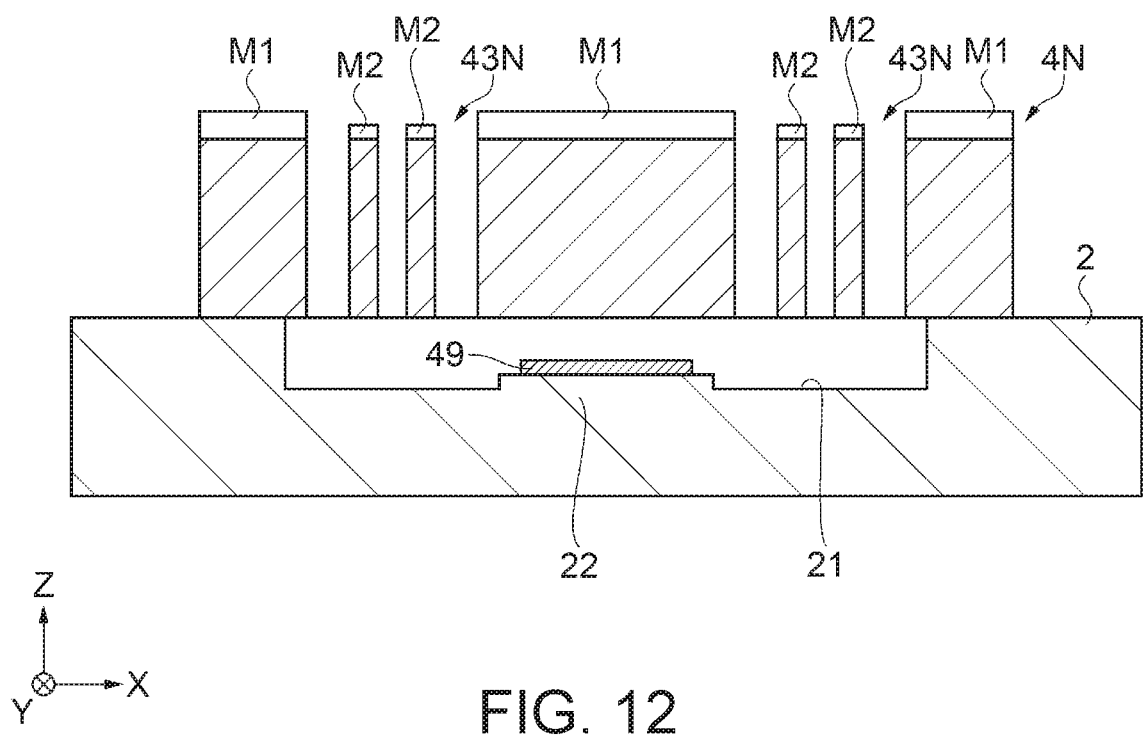
FIG. 12 is a process view for explaining a procedure 2 of forming the gyro element.
Figure 13:
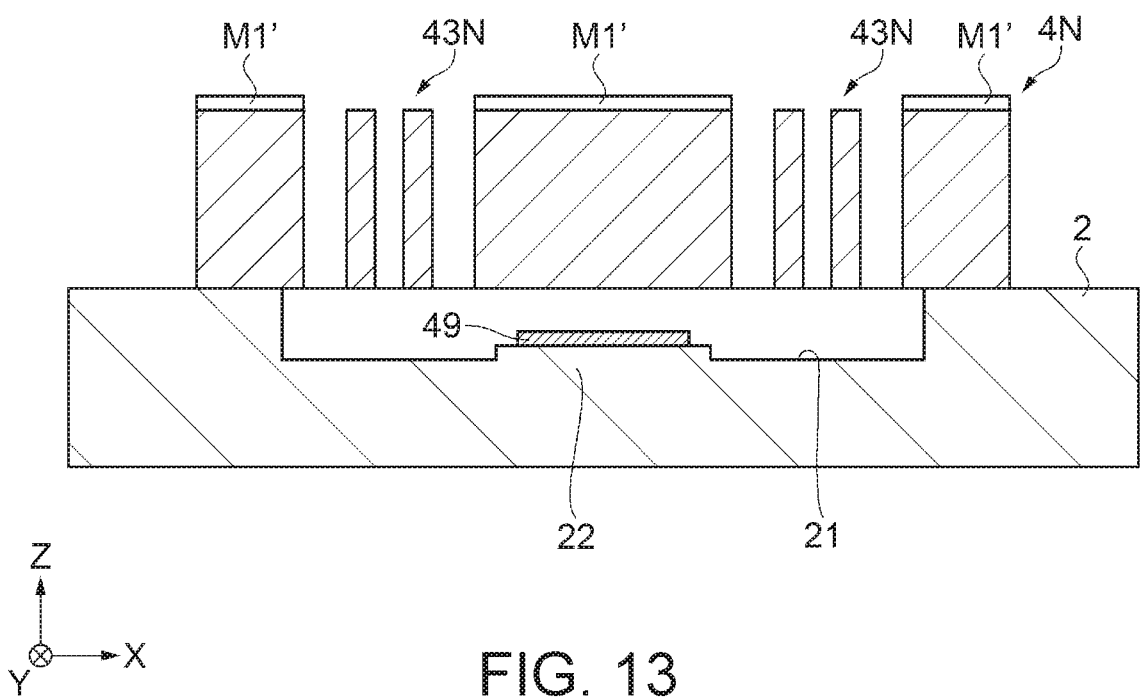
FIG. 13 is a process view for explaining a procedure 1 of forming a groove in beams of the gyro element.
Figure 14:
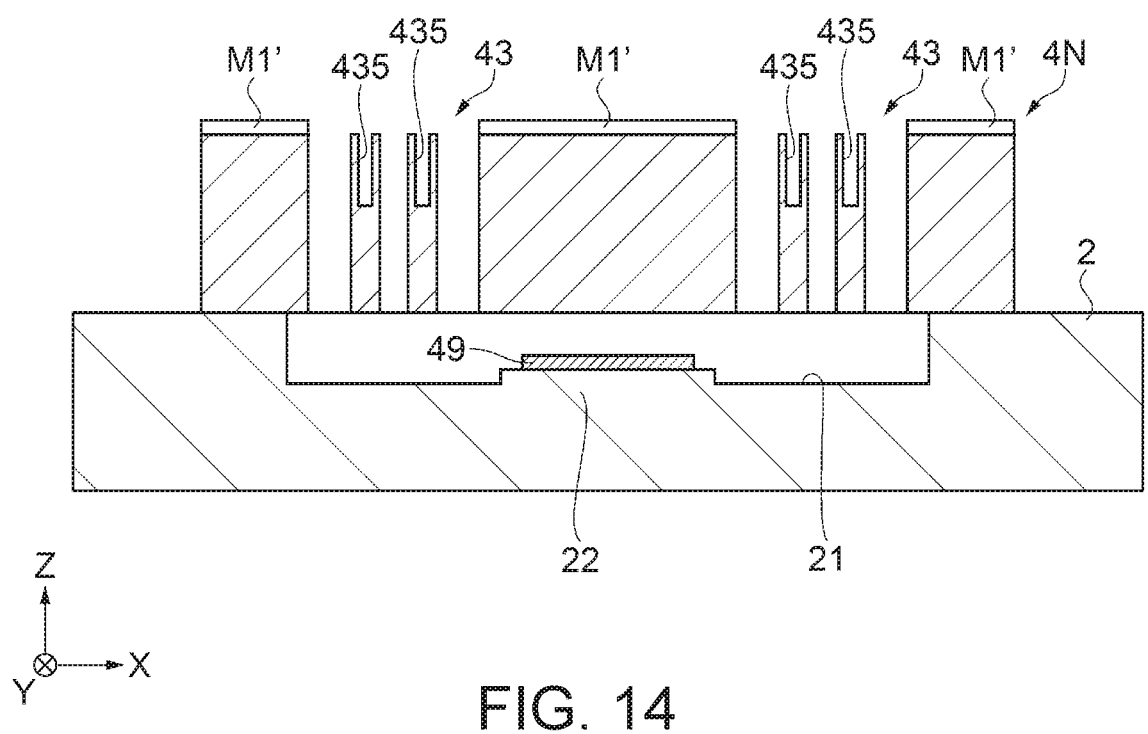
FIG. 14 is a process view for explaining a procedure 2 of forming the groove in the beams of the gyro element.
Figure 15:
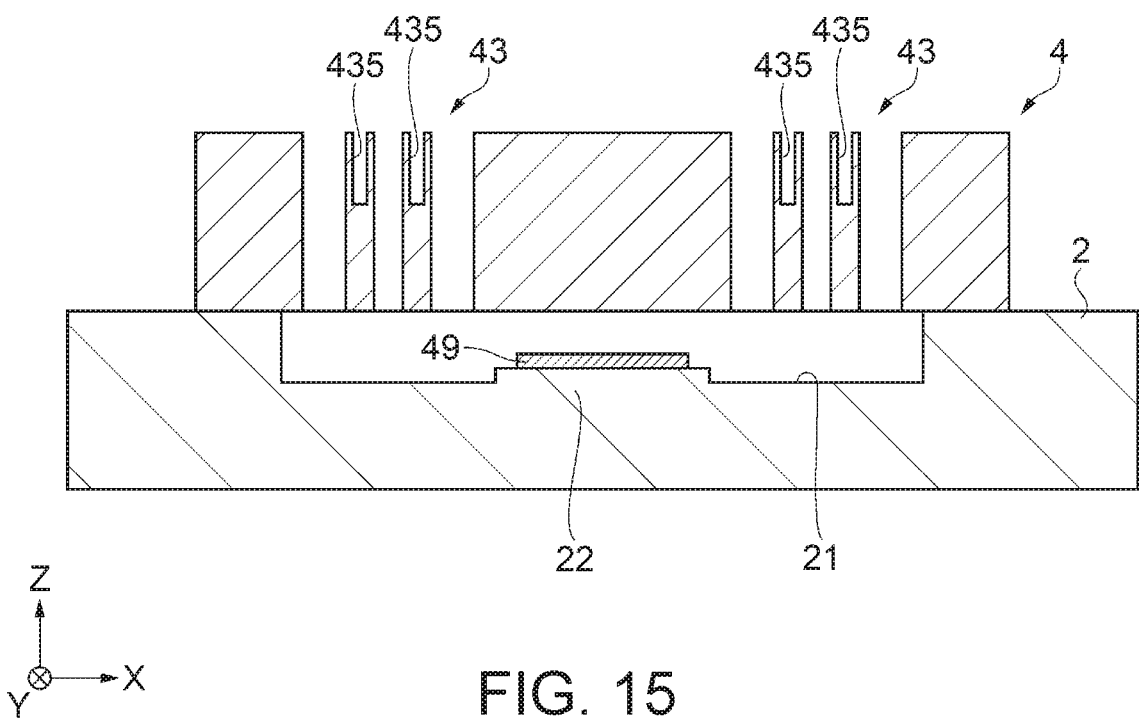
FIG. 15 is a process view for explaining a procedure 3 of forming the groove in the beams of the gyro element.
Figure 16:
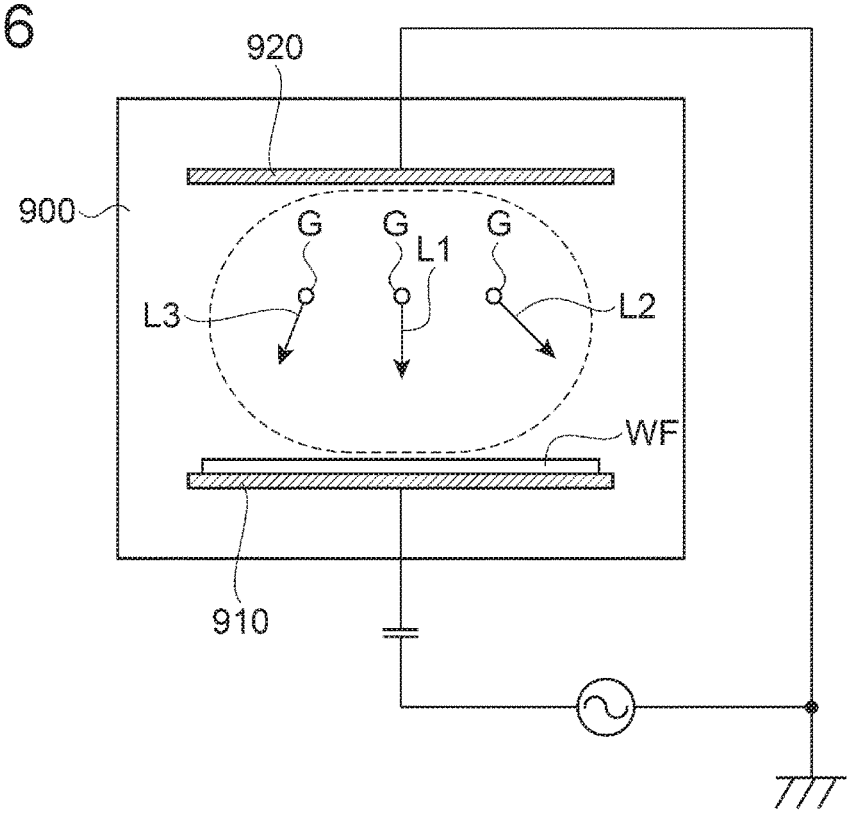
FIG. 16 is a configuration view showing an outline of a dry etching method.
Figure 17:
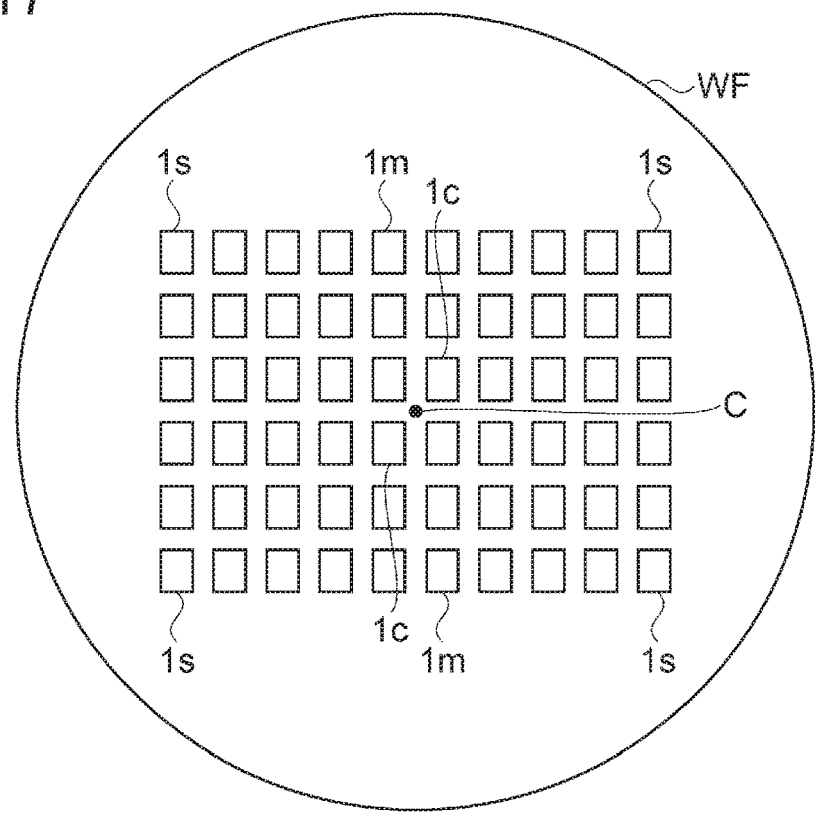
FIG. 17 is a plan view showing gyro sensors arranged on a wafer.

FIG. 9 is a flowchart showing processes in a method for manufacturing the gyro sensor (angular velocity sensor) according to the first embodiment. FIG. 10 is a process view for explaining a procedure of preparing a substrate. FIG. 11 is a process view for explaining a procedure 1 of forming a gyro element. FIG. 12 is a process view for explaining a procedure 2 of forming the gyro element. FIG. 13 is a process view for explaining a procedure 1 of forming a groove in beams of the gyro element. FIG. 14 is a process view for explaining a procedure 2 of forming the groove in the beams of the gyro element. FIG. 15 is a process view for explaining a procedure 3 of forming the groove in the beams of the gyro element. FIG. 16 is a configuration view showing an outline of a dry etching method. FIG. 17 is a plan view showing gyro sensors arranged on a wafer. The components of the gyro sensor 1 described below are denoted by the same reference signs as the above.

As shown in the flowchart of FIG. 9, the method for manufacturing the gyro sensor 1 includes [1] a process of preparing the substrate 2 (step S101), [2] a process of deciding the arrangement and shape of the groove 435 to be formed in the beam (first part 4301) of an elastic part 43N (step S102), [3] a process of forming an element 4N (step S103), [4] a process of forming the groove 435 in the beam (first part 4301) of the elastic part 43N, based on the decision (step S104), and [5] a process of bonding the lid 3 to the substrate 2 (step S105). Each process will be described in order below.

In the example described below, the substrate 2 is made of a glass material containing alkali metal ions, a member 40N to be the gyro sensor element 4 is made of a silicon material, and the lid 3 is made of a silicon material. The substrate 2 and the member 40N employ a configuration where a plurality of gyro sensor elements 4 (in FIG. 17, gyro sensors 1c, 1m, 1s) is arranged within the surface of a wafer WF, as shown in FIG. 17. In the following process views, the plurality of gyro sensor elements is not illustrated and one of the gyro sensor elements is illustrated as an example.

[1] Process of Preparing the Substrate 2 (Step S101)

First, in the process of preparing the substrate (step S101), a flat plate-like base member is patterned by photolithography and etching. Thus, the substrate 2 provided with the recessed part 21 having the protruding part 22 is prepared, as shown in FIG. 10.

[2] Process of Deciding the Arrangement and Shape of the Groove 435 (Step S102)

Next, in the process of deciding the arrangement and shape of the groove 435 to be formed in the beam (first part 4301) of the elastic part 43N (step S102), the arrangement positions of the groove 435 (number of grooves 435 arranged) and the shape such as length of the groove 435 are decided, considering the variation (variation in magnitude) of a quadrature generated due to the cross-sectional shape of the beam (first part 4301), which varies depending on the arrangement position on the wafer WF.

In this manufacturing method, the member 40N is processed by an etching process using a reactive plasma gas. In the processing of the member 40N with a reactive plasma gas, a plasma state is created between a stage electrode 910 and a counter electrode 920 provided opposite the stage electrode 910 within a chamber 900, and a reaction gas G is accelerated to strike the wafer WF, for example, as shown in FIG. 16. Thus, elements 4N on the wafer WF can be processed. In this case, the reaction gas G moves (becomes accelerated) radially from a center part of the chamber 900 due to the influence of plasma distribution (density) or the like. Therefore, the elements 4N tend to be processed obliquely as it goes toward the outer edge of the wafer WF. Specifically, the angle of incidence at the center part of the wafer WF is substantially perpendicular to the wafer WF as indicated by an arrow L1, whereas the angle of incidence at outer peripheral parts tilts with respect to the wafer WF as indicated by arrows L2, L3. This causes variations in perpendicular processing accuracy within the wafer WF. Thus, as the element 4N is closer to the outer edge of the wafer WF, the element 4N tends to be processed in such a way that the elastic part 43 has a greater tilt, and therefore the inherent vibration component in the Z-axis direction (quadrature signal) tends to increase.

Consequently, in the resulting element 4N and particularly in the beam of the elastic part 43 (first part 4301), the magnitude of the quadrature signal varies due to the difference in the tilt angle of the first lateral surface 433 and the second lateral surface 434. Based on this variation in the magnitude of the quadrature signal, the arrangement position of the groove 435 and the shape such as length of the groove 435, provided to reduce the quadrature signal, are decided. For example, in an element arranged at an outer peripheral part away from the center c of the wafer WF, the number of first parts 4301 as beams where the groove 435 is arranged is increased or the length in the longitudinal direction of the groove 435 is increased, compared with an element arranged at a position near the center c. While a processing error due to a reactive plasma gas is described as an example in this embodiment, a processing error or the like can be generated by other methods.

[3] Process of Forming the Element 4N (Step S103)

Next, in the process of forming the element 4N (step S103), an element 4N having a mass part 41, a plurality of fixed parts 42, a plurality of elastic parts 43, a plurality of drive parts 44, a plurality of fixed drive parts 45, 46, detection parts 471, 472, and a plurality of beam support beams 48, as shown in FIG. 3, is formed. The element 4N shown in FIG. 12 and onward becomes the gyro sensor element 4 via a process described later. The elastic part 43N becomes the elastic part 43 via a process described later. The fixed detection unit 49 can be formed on the upper surface of the protruding part 22.

Specifically, first, the plate-like member 40N is prepared and bonded onto the substrate 2, for example, by anodic bonding (see FIG. 11). A hard mask is formed on the member 40N thus bonded. The hard mask is made up of two masks with different thicknesses (two-stage mask) and includes a first mask M1 and a second mask M2 having a smaller thickness than the first mask M1. In this case, the second mask M2 is arranged, based on the arrangement and shape of the groove 435 decided in step S102. The member 40N is patterned by etching into the element 4N including the elastic part 43N (see FIG. 12). In this embodiment, the Bosch process, which is a deep reactive ion etching technique using a combination of an etching process with a reactive plasma gas and a deposition process, is preferably used to etch the member 40N. The member 40N may be, for example, ground to a reduced thickness before being patterned by photolithography and etching.

[4] Process of Forming the Groove in the Elastic Part 43N (Step S104)

Next, in the process of forming the groove in the elastic part 43N (step S104), the two-stage mask is etched to remove the thinner second mask M2, leaving the first mask M1' having a reduced thickness (see FIG. 13). Thus, the element 4N at the part corresponding to the elastic part 43 is exposed. The exposed part corresponding to the elastic part 43N is etched by the Bosch process, thus forming the groove 435 in the first part 4301 as a beam (see FIG. 14). The first mask M1' is then removed. The elastic part 43 can thus be formed and the gyro sensor element 4 bonded to the substrate 2 can be formed (see FIG. 15).

[5] Process of Bonding the Lid 3 to the Substrate 2 (Step S105)

Next, though not illustrated, the lid 3 having the recessed part 31 is bonded to the upper surface of the substrate 2. Thus, the recessed part 21 of the substrate 2 and the recessed part 31 of the lid 3 form the space S accommodating the gyro sensor element 4. The gyro sensor 1 shown in FIG. 2 can thus be provided.

Although not illustrated, the plurality of gyro sensors 1 arranged within the surface of the wafer WF (on the wafer WF) is separated into individual pieces, using a dicing blade (not illustrated) or the like in a separation process provided after the process of bonding the lid 3 to the substrate 2 (step S105). This process can provide the gyro sensors 1 as individual pieces.

Although not illustrated, the lid 3 may be provided with a penetration hole that communicates the inside and outside of the space S. If the lid 3 has the penetration hole, after the space S is formed, the space S may be sucked to a vacuum through the penetration hole and subsequently the penetration hole may be closed. Thus, the space S can turn into a pressure-reduced (vacuum) state.

In the method for manufacturing the gyro sensor 1 described above, at least one of the number of beams (first parts 4301) where the groove 435 is to be formed and the length in the longitudinal direction of the groove 435 is decided according to the distribution (arrangement positions within the surface of the wafer WF) of the gyro sensors 1 (gyro sensor elements 4 arranged within the surface of the wafer WF, and the groove 435 is formed based on the decision. Therefore, the method can manufacture the gyro sensor 1 in which the irregular occurrence of the quadrature signal within the surface of the wafer WF is reduced.

Inertial Measurement Unit

Figure 18:
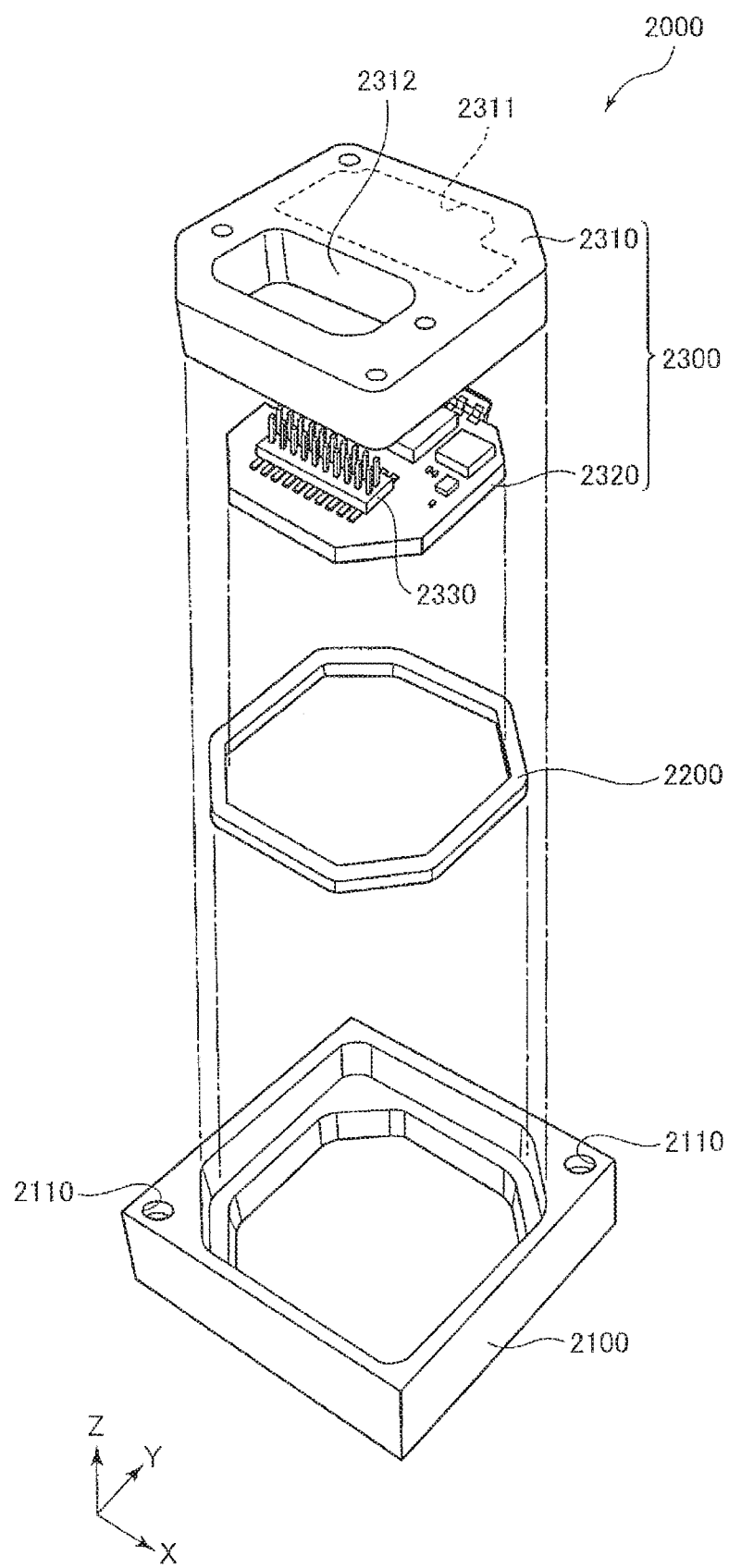
FIG. 18 is an exploded perspective view showing a schematic configuration of an inertial measurement unit.
Figure 19:
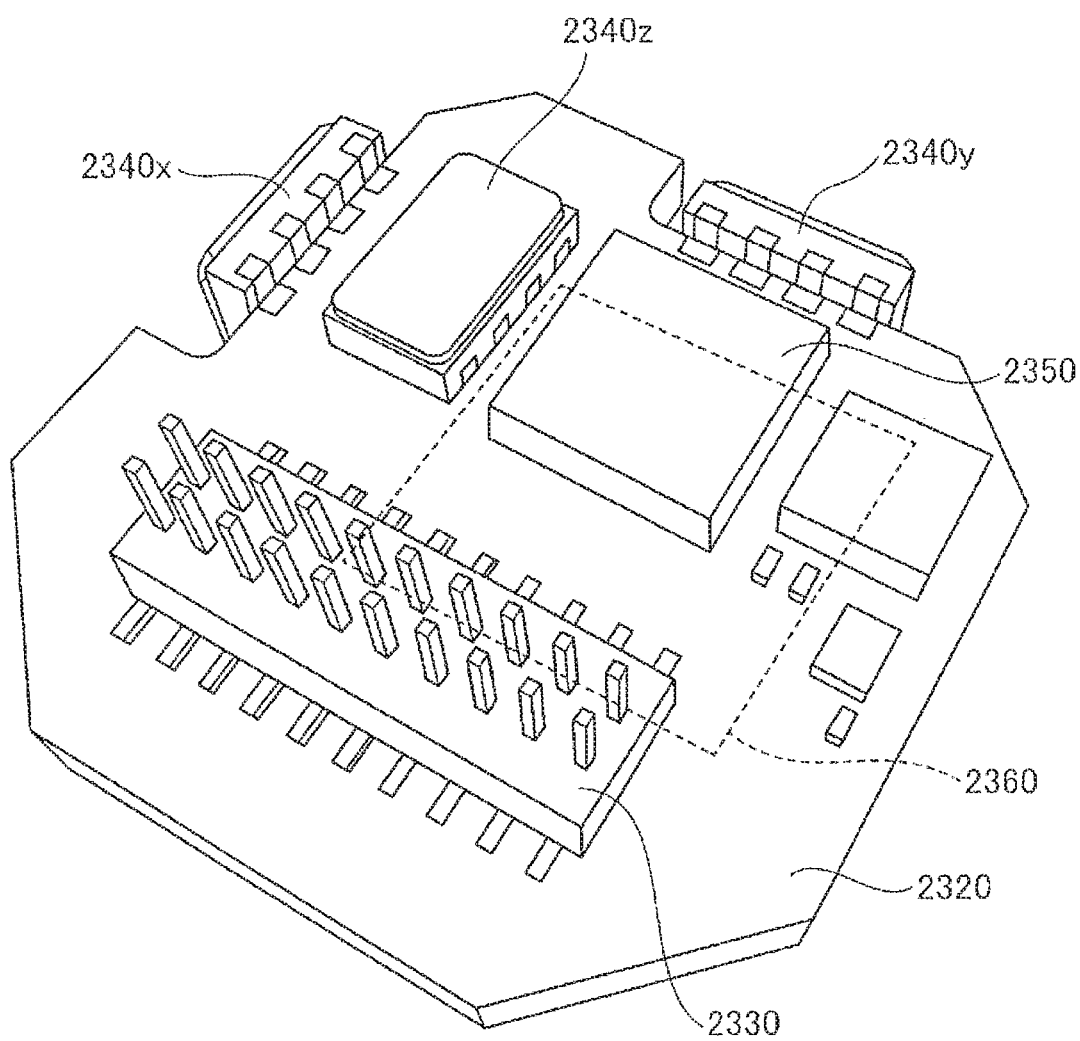
FIG. 19 is a perspective view showing an arrangement example of an inertial sensor element of the inertial measurement unit.

Next, an inertial measurement unit (IMU) will be described with reference to FIGS. 18 and 19. FIG. 18 is an exploded perspective showing a schematic configuration of the inertial measurement unit. FIG. 19 is a perspective view showing an arrangement example of an inertial sensor element of the inertial measurement unit.

An inertial measurement unit 2000 (IMU) shown in FIG. 18 is a device which detects an attitude and behavior (amount of inertial motion) of a moving body (installation target device) such as an automobile or robot. The inertial measurement unit 2000 functions as a so-called 6-axis motion sensor having an acceleration sensor for three axes and an angular velocity sensor for three axes.

The inertial measurement unit 2000 is a rectangular parallelepiped which is substantially square when viewed in a plan view. Near two vertices situated in a diagonal direction of the square, screw holes 2110 as fixing parts are formed. Two screws can be inserted into the two screw holes 2110, thus fixing the inertial measurement unit 2000 onto an installation target surface of an installation target object such as an automobile. Properly selecting components or changing design enables miniaturizing the inertial measurement unit 2000 into a size that can be installed, for example, on a smartphone or digital camera.

The inertial measurement unit 2000 has an outer case 2100, a joining member 2200, and a sensor module 2300. The sensor module 2300 is inserted in the outer case 2100 via the joining member 2200. The sensor module 2300 has an inner case 2310 and a substrate 2320.

The outer shape of the outer case 2100 is a rectangular parallelepiped which is substantially square when viewed in a plan view, similarly to the overall shape of the inertial measurement unit 2000. The screw holes 2110 are formed near two vertices in a diagonal direction of the square. The outer case 2100 is in the shape of a box, with the sensor module 2300 accommodated inside.

The inner case 2310 is a member supporting the substrate 2320 and has a shape to fit inside the outer case 2100. In the inner case 2310, a recessed part 2311 for preventing contact with the substrate 2320 and an opening 2312 for exposing a connector 2330, described later, are formed. Such an inner case 2310 is bonded to the outer case 2100 via the joining member 2200 (for example, a packing impregnated with an adhesive). The substrate 2320 is bonded to a lower surface of the inner case 2310 via an adhesive.

As shown in FIG. 19, on an upper surface of the substrate 2320, components such as the connector 2330, an angular velocity sensor 2340z which detects an angular velocity about the Z-axis, and an acceleration sensor 2350 which detects an acceleration in each of the X-axis, Y-axis, and Z-axis directions, are installed. On lateral surfaces of the substrate 2320, an angular velocity sensor 2340x which detects an angular velocity about the X-axis, and an angular velocity sensor 2340y which detects an angular velocity about the Y-axis are installed. The angular velocity sensors 2340z, 2340x, 2340y are not particularly limited and can be the gyro sensor 1 using a Coriolis force. The acceleration sensor 2350 is not particularly limited and can be an electrostatic acceleration sensor or the like.

On a lower surface of the substrate 2320, a control IC 2360 is installed. The control IC 2360 is a MCU (micro controller unit) and has a storage unit including a non-volatile memory and an A/D converter or the like built inside. The control IC 2360 thus controls each part of the inertial measurement unit 2000. In the storage unit, a program prescribing an order and content for detecting acceleration and angular velocity, a program for digitizing and incorporating detection data into packet data, and accompanying data and the like are stored. In addition to these components, a plurality of other electronic components is installed on the substrate 2320.

The inertial measurement unit 2000 has been described above. Such an inertial measurement unit 2000 includes the angular velocity sensors 2340z, 2340x, 2340y, the acceleration sensor 2350, and the control IC 2360 (control circuit) for controlling driving of the sensors 2340z, 2340x, 2340y, 2350. Thus, the inertial measurement unit 2000 can achieve the effects of the foregoing gyro sensor 1 and can realize high reliability.

Portable Electronic Apparatus

Next, a portable electronic apparatus using the gyro sensor 1 will be described in detail with reference to FIGS.

20 and 21. As an example of the portable electronic apparatus, a wristwatch-type activity tracker (active tracker) will be described below.

Figure 20:
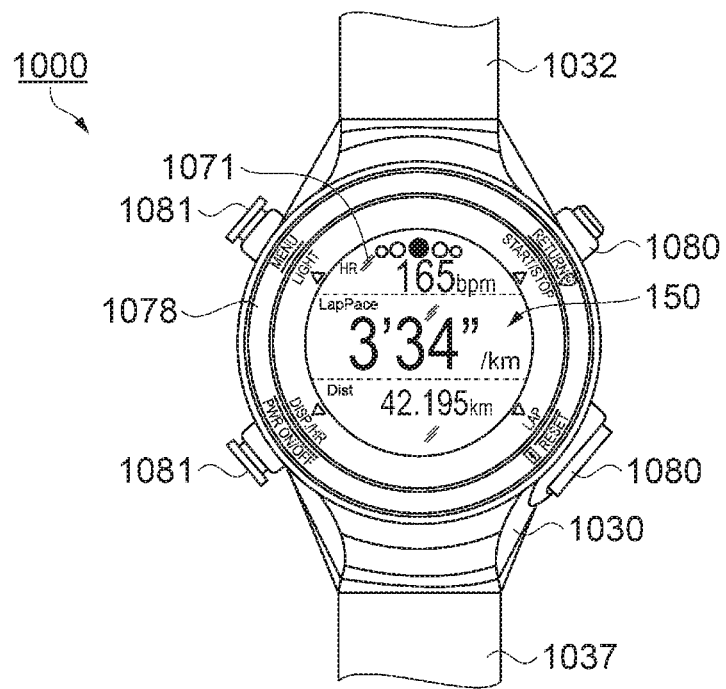
FIG. 20 is a plan view schematically showing a configuration of a portable electronic apparatus.
Figure 21:
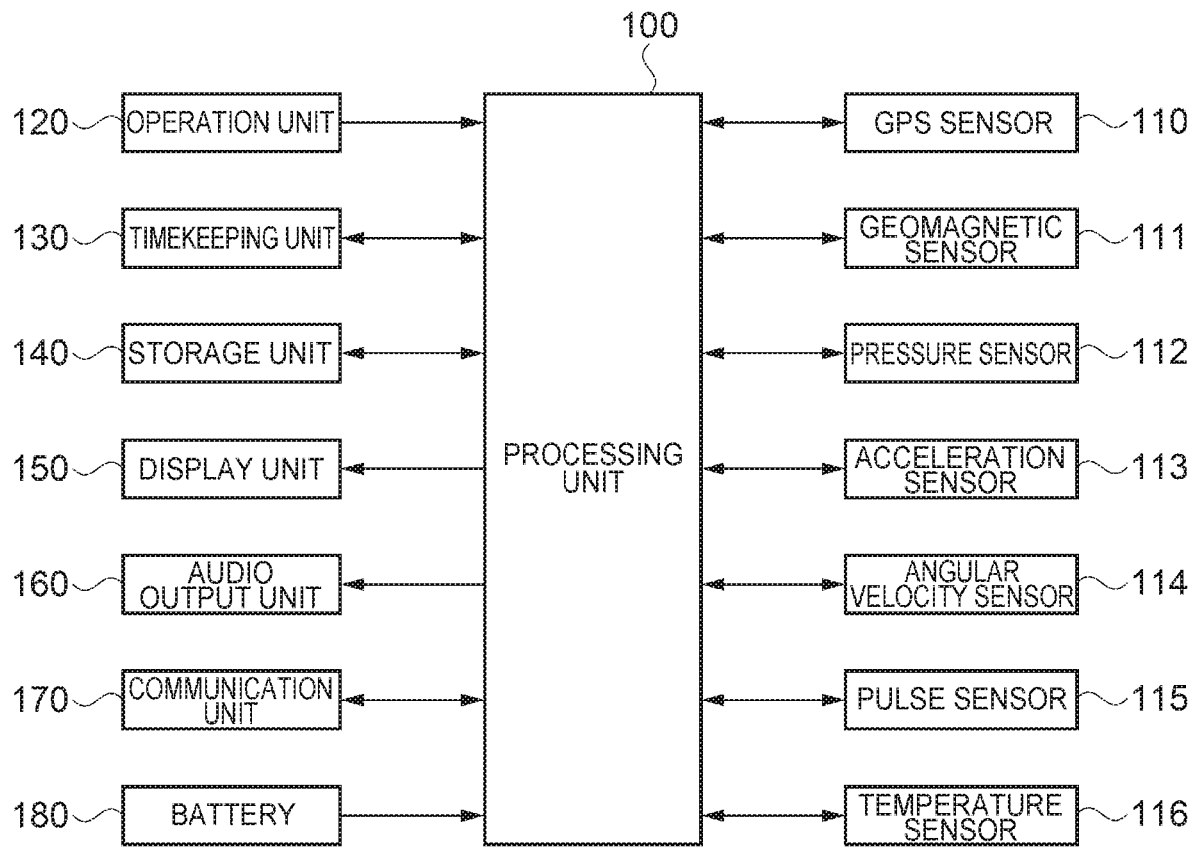
FIG. 21 is a functional block diagram showing a schematic configuration of the portable electronic apparatus.

A wrist device 1000, which is a wristwatch-type activity tracker (active tracker), is installed at a site (subject) such as a user's wrist with straps 1032, 1037 or the like, as shown in FIG. 20. The wrist device 1000 has a digital display unit 150 and can communicate wirelessly. The foregoing gyro sensor 1 is incorporated in the wrist device 1000 as an angular velocity sensor 114 (see FIG. 21) which measures an angular velocity, together with a sensor for measuring an acceleration or the like.

The wrist device 1000 has a case 1030 which accommodates at least the angular velocity sensor 114 (see FIG. 21), a processing unit 100 (see FIG. 21) which is accommodated in the case 1030 and processes output data from the angular velocity sensor 114, a display unit 150 accommodated in the case 1030, and a light-transmissive cover 1071 closing the opening of the case 1030. A bezel 1078 is provided on the outside of the light-transmissive cover 1071 of the case 1030. On the lateral side of the case 1030, a plurality of operation buttons 1080, 1081 are provided. The wrist device 1000 will now be described further in detail, also with reference to FIG. 21.

An acceleration sensor 113 detects an acceleration in each of three axial directions intersecting each other (ideally, orthogonal to each other) and outputs a signal (acceleration signal) corresponding to the magnitude and direction of the detected accelerations on the three axes. The angular velocity sensor 114 detects an angular velocity in each of three axial directions intersecting each other (ideally, orthogonal to each other) and outputs a signal (angular velocity signal) corresponding to the magnitude and direction of the detected angular velocities on the three axes.

A liquid crystal display (LCD) forming the display unit 150 can display, for example, location information using a GPS sensor 110 and a geomagnetic sensor 111, motion information such as the amount of movement or the amount of motion using the acceleration sensor 113 or the angular velocity sensor 114 or the like, biological information such as pulse rate using a pulse sensor 115 or the like, or time information such as the current time, according to various detection modes. The display unit 150 can also display ambient temperature using a temperature sensor 116.

A communication unit 170 carries out various kinds of control to establish communication between a user terminal and an information terminal, not illustrated. The communication unit 170 includes a transmitter/receiver conforming to a short-range wireless communication standard such as Bluetooth (trademark registered) (including BTLE (Bluetooth Low Energy)), Wi-Fi (trademark registered) (Wireless Fidelity), Zigbee (trademark registered), NFC (Near Field Communication), or ANT+ (trademark registered), and a connector conforming to a communication bus standard such as USB (Universal Serial Bus).

The processing unit 100 (processor) is made up of, for example, a MPU (micro processing unit), DSP (digital signal processor), ASIC (application specific integrated circuit), or the like. The processing unit 100 executes various kinds of processing, based on a program stored in a storage unit 140 and a signal inputted from an operation unit 120 (for example, operation buttons 1080, 1081). The processing by the processing unit 100 includes data processing on an output signal from each of the GPS sensor 110, the geomagnetic sensor 111, a pressure sensor 112, the acceleration sensor 113, the angular velocity sensor 114, the pulse sensor 115, the temperature sensor 116, and a timekeeping unit 130, display processing to cause the display unit 150 to display an image, audio output processing to cause an audio output unit 160 to output a sound, communication processing to communicate with an information terminal via the communication unit 170, and power control processing to supply electric power from a battery 180 to each part, or the like.

Such a wrist device 1000 can have at least the following functions.

1. Distance: to measure the total distance from the start of measurement by highly accurate GPS functions.
2. Pace: to display the current traveling pace, based on a pace distance measurement value.
3. Average speed: to calculate and display the average speed from the start of traveling to the present.
4. Elevation above sea level: to measure and display the elevation above sea level by GPS functions.
5. Stride: to measure and display the stride even in a tunnel or the like which GPS radio waves do not reach.
6. Pitch: to measure and display the number of steps taken per minute.
7. Heart rate: to measure and display heart rate by the pulse sensor.
8. Gradient: to measure and display the gradient of the ground in training in mountains or trail running.
9. Auto lap: to automatically measure laps when the user runs a predetermined distance or for a predetermined time that is set in advance.
10. Calories burned by exercise: to display calories burned.
11. Numbers of steps taken: to display the total number of steps taken from the start of exercise.

The wrist device 1000 can be broadly applied to various watches such as running watch, runner's watch, runner's watch for multiple sports including duathlon and triathlon, outdoor watch, and satellite positioning system watch such as GPS watch equipped with GPS.

While GPS (Global Positioning System) is used as the satellite positioning system in the above description, other global navigation satellite systems (GNSS) may also be used. For example, one, or two or more of satellite positioning systems such as EGNOS (European Geostationary-Satellite Navigation Overlay Service), QZSS (Quasi Zenith Satellite System), GLONASS (Global Navigation Satellite System), GALILEO, and BeiDou (BeiDou Navigation Satellite System) may be used. Also, as at least one of the satellite positioning systems, a stationary satellite-based augmentation system (SBAS) such as WAAS (Wide Area Augmentation System) or EGNOS (European Geostationary-Satellite Navigation Overlay Service) may be used.

Such a portable electronic apparatus has the gyro sensor 1 and the processing unit 100 and is therefore very reliable.

Electronic Apparatus

Next, an electronic apparatus using the gyro sensor 1 will be described in detail with reference to FIGS. 22 to 24.

First, a mobile personal computer as an example of the electronic apparatus is described with reference to FIG. 22. FIG. 22 is a perspective view schematically showing the configuration of the mobile personal computer as an example of the electronic apparatus.

In this illustration, a personal computer 1100 is made up of a main body section 1104 having a keyboard 1102, and a display unit 1106 having a display section 1108. The display unit 1106 is supported in such a way as to be able to pivot about the main body section 1104 via a hinge structure. The gyro sensor 1 functioning as an angular velocity sensor is built in such a personal computer 1100. Based on detection data from the gyro sensor 1, a control unit 1110 can perform control such as attitude control.

Figure 23:
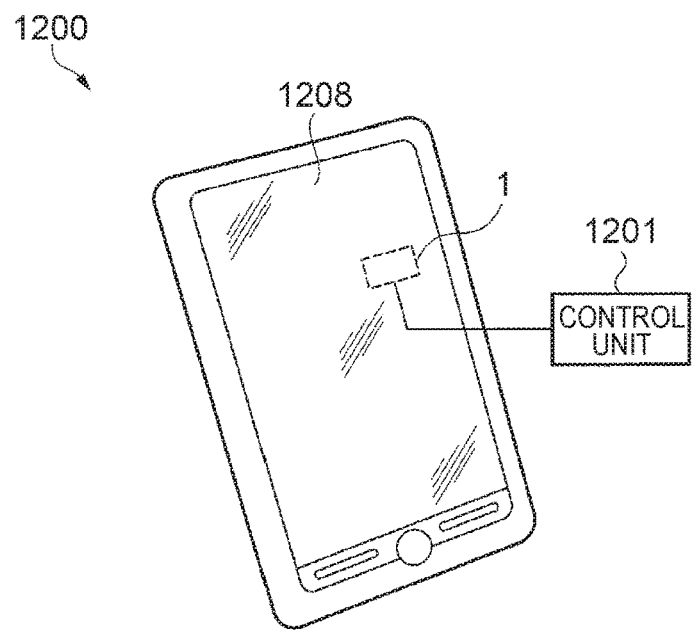
FIG. 23 is a perspective view schematically showing a configuration of a smartphone (mobile phone) as an example of an electronic apparatus.

FIG. 23 is a perspective view schematically showing the configuration of a smartphone (mobile phone) as an example of the electronic apparatus.

In this illustration, the gyro sensor 1 is incorporated in a smartphone 1200. Detection data (angular velocity data) detected by the gyro sensor 1 is transmitted to a control unit 1201 of the smartphone 1200. The control unit 1201 includes a CPU (central processing unit). The control unit 1201 thus can recognize the attitude and behavior of the smartphone 1200, based on the received detection data, and can change a display image displayed on a display unit 1208, output a warning sound or a sound effect, and drive a vibration motor to vibrate the main body. In other words, the control unit 1201 can carry out motion sensing of the smartphone 1200, and change the display content or generate a sound or vibration, based on the measured attitude and behavior. Particularly, when executing a game application, the user can enjoy a sense of reality.

Figure 24:
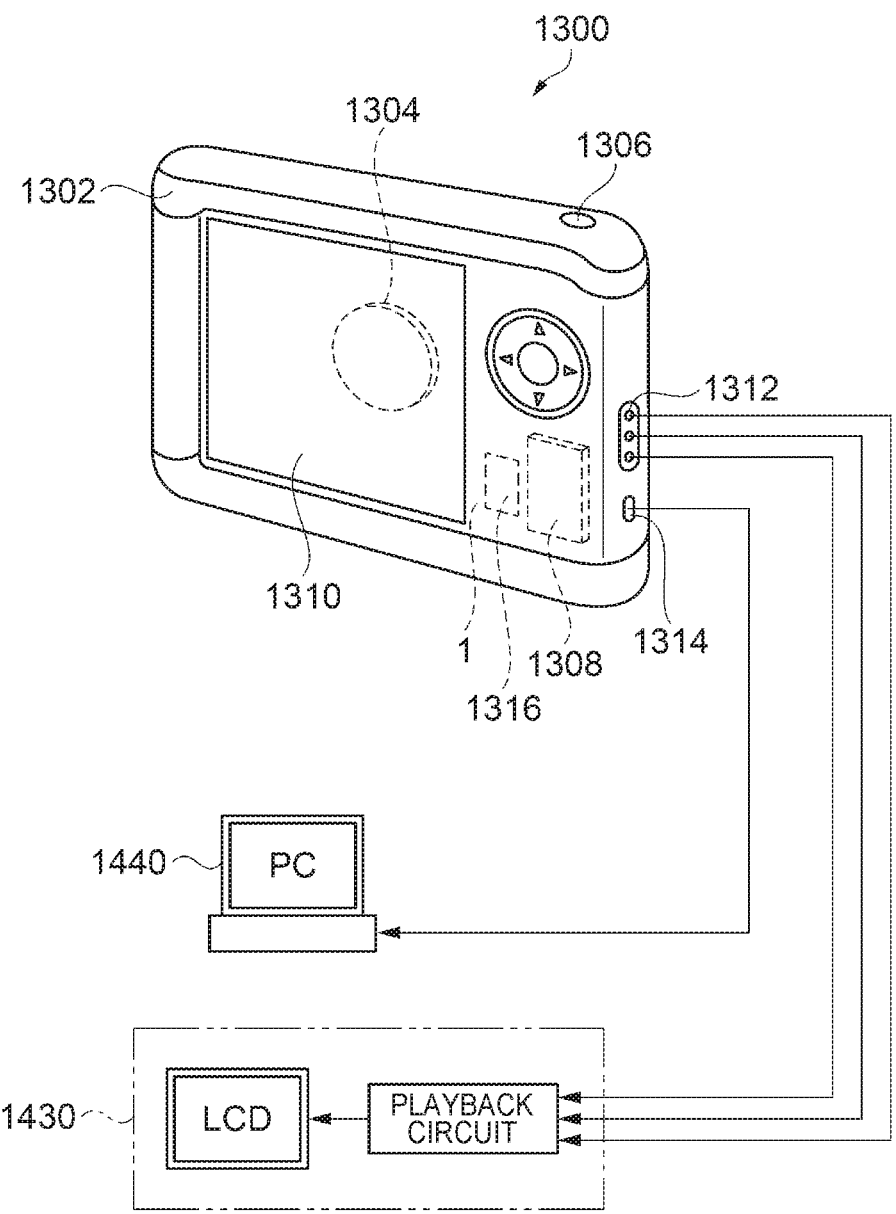
FIG. 24 is a perspective view showing a configuration of a digital still camera as an example of an electronic apparatus.

FIG. 24 is a perspective view showing the configuration of a digital still camera as an example of the electronic apparatus. This illustration also shows connections to external devices in a simplified manner.

In this illustration, a display unit 1310 is provided on the back side of a case (body) 1302 of a digital still camera 1300, to display an image based on a picked-up image signal from a CCD. The display unit 1310 also functions as a viewfinder showing a subject as an electronic image. On the front side (back side in the illustration) of the case 1302, a light receiving unit 1304 including an optical lens (image pickup optical system) and a CCD or the like is provided.

The photographer confirms a subject image displayed on the display unit 1310 and presses a shutter button 1306. In response to this, a picked-up image signal from the CCD at that point is transferred to and stored in a memory 1308. On a lateral side of the case 1302 of the digital still camera 1300, a video signal output terminal 1312 and a data communication input/output terminal 1314 are provided. As illustrated, a television monitor 1430 is connected to the video signal output terminal 1312, and a personal computer 1440 is connected to the data communication input/output terminal 1314, according to need. Also, in response to a predetermined operation, the picked-up image signal stored in the memory 1308 is outputted to the television monitor 1430 and the personal computer 1440. The gyro sensor 1 functioning as an angular velocity sensor is built in such a digital still camera 1300. Based on detection data from the gyro sensor 1, a control unit 1316 can perform control such as camera shake correction.

Such electronic apparatuses have the gyro sensor 1 and the control units 1110, 1201, 1316 and are therefore very reliable.

Figure 22:
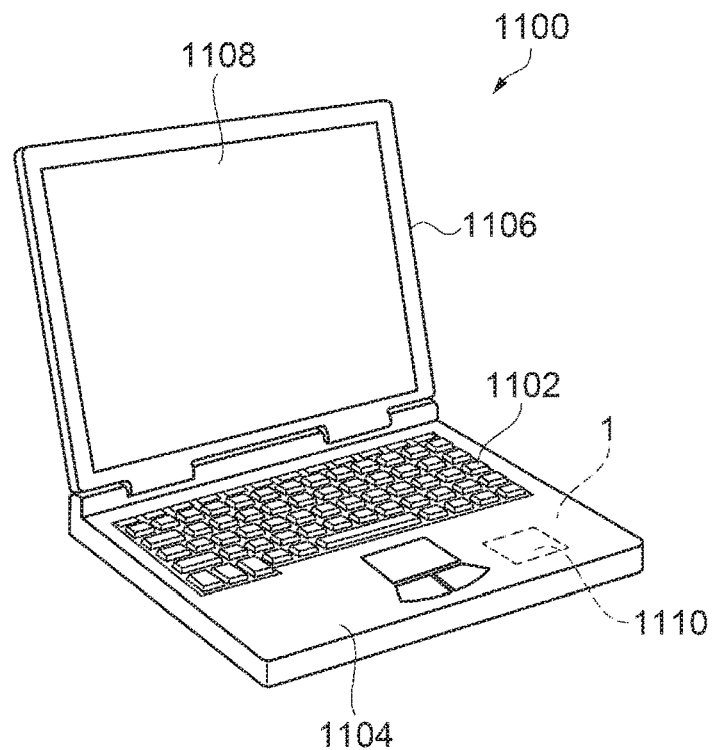
FIG. 22 is a perspective view schematically showing a configuration of a mobile personal computer as an example of an electronic apparatus.

The electronic apparatus having the gyro sensor 1 can be applied not only to the personal computer of FIG. 22, the smartphone (mobile phone) of FIG. 23, and the digital still camera of FIG. 24, but also to a tablet terminal, timepiece, inkjet ejection device (for example, inkjet printer), laptop personal computer, television, video camera, video tape recorder, car navigation device, pager, electronic organizer (including electronic organizer with communication functions), electronic dictionary, electronic calculator, electronic game device, word processor, workstation, videophone, security monitor, electronic binoculars, POS terminal, medical equipment (for example, electronic body thermometer, blood pressure monitor, blood sugar monitor, electrocardiograph, ultrasonic diagnostic device, electronic endoscope), fishfinder, various measuring devices, instruments (for example, instruments of vehicle, aircraft, ship), flight simulator, seismometer, pedometer, clinometer, vibration gauge which measures vibrations of a hard disk, attitude control device for a robot or a flying object such as a drone, control device used for inertial navigation for automatic driving of an automobile, and the like.

Vehicle

Figure 25:
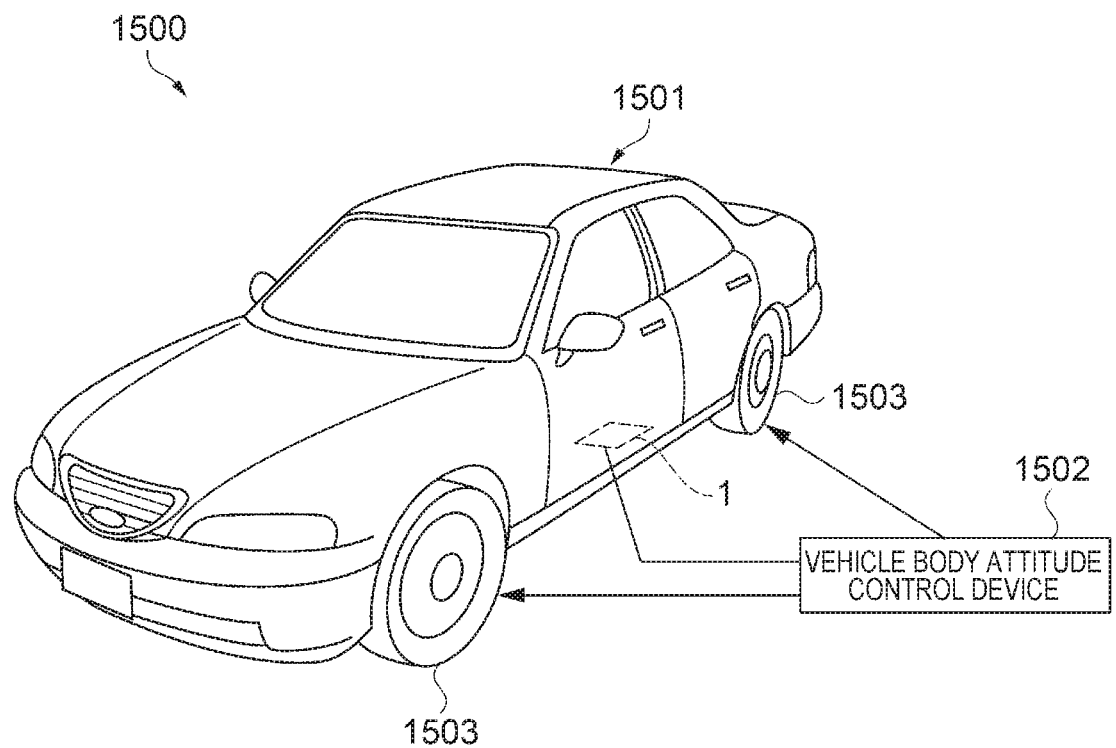
FIG. 25 is a perspective view showing a configuration of an automobile as an example of a vehicle.

Next, a vehicle using the gyro sensor 1 is shown in FIG. 25 and described in detail. FIG. 25 is a perspective view showing the configuration of an automobile as an example of the vehicle.

As shown in FIG. 25, the gyro sensor 1 is built in an automobile 1500. For example, the gyro sensor 1 can detect the attitude of a vehicle body 1501. A detection signal from the gyro sensor 1 is supplied to a vehicle body attitude control device 1502 as an attitude control unit which controls the attitude of a vehicle body. Based on the signal, the vehicle body attitude control device 1502 can detect the attitude of the vehicle body 1501 and can control stiffness/softness of suspension or control braking on individual wheels 1503 according to the result of the detection. The gyro sensor 1 can also be applied broadly to keyless entry, immobilizer, car navigation system, car air-conditioning, anti-lock braking system (ABS), airbags, tire pressure monitoring system (TPMS), engine control, control device for automatic driving inertial navigation, and electronic control unit (ECU) such as battery monitor for hybrid car or electric vehicle.

The gyro sensor 1 applied to the vehicle can also be applied to, for example, attitude control of a two-legged robot, train or the like, attitude control of remote-controlled or autonomous flying object such as radio-controlled airplane, radio-controlled helicopter, or drone, attitude control of agricultural machinery (farm machine) or construction machinery (building machine), and control of rocket, artificial satellite, ship, AGV (automated guided vehicle), or two-legged robot, in addition to the foregoing examples. As described above, to implement attitude control of various vehicles, the gyro sensor 1 and a control unit (not illustrated) for each vehicle are incorporated in each vehicle.

Such a vehicle has the gyro sensor 1 and the control unit (for example, vehicle body attitude control device 1502 as the attitude control unit) and is therefore very reliable.

The physical quantity sensor, the inertial measurement unit, the portable electronic apparatus, the electronic apparatus, and the vehicle have been described above, based on the illustrated embodiments. However, the invention is not limited to these embodiments. The configuration of each part can be replaced by any configuration having similar functions. Also, other arbitrary components may be added to the invention.

In the embodiments, the X-axis, the Y-axis, and the Z-axis are orthogonal to each other. However, these axes are not limited to being orthogonal to each other, provided that these axes intersect each other. For example, the X-axis may slightly tilt from the direction of the normal line to the YZ plane. The Y-axis may slightly tilt from the direction of the normal line to the XZ plane. The Z-axis may slightly tilt from the direction of the normal line to the XY plane. The term "slightly" refers to such an extent that the physical quantity sensor (gyro sensor 1) can achieve its effects. The specific tilt angle (numerical value) varies depending on the configuration or the like.

What is claimed is:

1. An inertial sensor comprising:
   three directions orthogonal to each other being defined as an X direction, a Y direction, and a Z direction;
   a substrate having a recess and a ledge;

a fixed detection electrode disposed in the recess of the substrate; and a sensor body that is generally plate-shaped on a plane along the X direction and the Y direction, a periphery of the sensor body being disposed on the ledge of the substrate, a bottom surface of the sensor body facing the fixed detection electrode along the Z direction, the sensor body being configured with:

a mass facing the fixed detection electrode along the Z direction, the mass being movable when an external force is applied to the inertial sensor;

a fixed member that fixes the sensor body to the substrate;

a movable electrode continuously extending from a periphery of the mass, the movable electrode being movable along with the mass;

a fixed electrode fixed on the ledge of the substrate and facing the movable electrode in the X direction and the Y direction; and an elastic member connecting between the mass and the fixed member, the elastic member being configured with:

a plurality of beams extending along the X direction and being parallel to each other along the Y direction, each of the plurality of beams having first and second side surfaces on planes along the X direction and the Z direction;

a plurality of joints connecting adjacent two beams of the plurality of beams, the plurality of joints extending along the Y direction; and a groove formed in a first surface of a first beam of the plurality of beams, the groove extending along the X direction, the first surface of the first beam being along the X direction and the Y direction, wherein a first width along the Y direction between the groove and the first side surface of the first beam is T1, a second width along the Y direction between the groove and the second side surface of the first beam is T2, and $0.9 \leq T1/T2 \leq 1.1$.

2. The inertial sensor according to claim 1, wherein the groove is provided at a center of the first beam in the X direction.

3. The inertial sensor according to claim 1, wherein the first beam has a second surface opposite to the first surface of the first beam in the Z direction, and the first surface of the first beam is a recessed surface that is recessed toward the second surface of the first beam.

4. The inertial sensor according to claim 2, wherein the first beam has a second surface opposite to the first surface of the first beam in the Z direction, and the first surface of the first beam is a recessed surface that is recessed toward the second surface of the first beam.

5. The inertial sensor according to claim 3, wherein the recessed surface is a curved surface.

6. The inertial sensor according to claim 4, wherein the recessed surface is a curved surface.

7. The inertial sensor according to claim 1, wherein the first and second widths T1 and T2 satisfy $0.05 \, \mu m \leq T1 \leq 0.5 \, \mu m$, and $0.05 \, \mu m \leq T2 \leq 0.5 \, \mu m$.

8. The inertial sensor according to claim 1, wherein the inertial sensor is an angular velocity sensor that is configured to detect an angular velocity as the external force.

9. An inertial measurement unit comprising:

the inertial sensor according to claim 8;

an acceleration sensor; and a control unit which controls the inertial sensor and the acceleration sensor.

10. A portable electronic apparatus comprising:

the inertial sensor according to claim 1;

a case which accommodates the inertial sensor;

a processing unit which is accommodated in the case and processes output data from the inertial sensor;

a display unit accommodated in the case; and a light-transmissive cover which closes an opening of the case.

11. The portable electronic apparatus according to claim 10, further comprising a satellite positioning system, wherein the processing unit is configured to process signals from the satellite positioning system to measure a moving distance or a trajectory of movement of a user holding the portable electronic apparatus.

12. An electronic apparatus comprising:

the inertial sensor according to claim 1; and a control unit which performs control based on a detection signal outputted from the inertial sensor.

13. A vehicle comprising:

the inertial sensor according to claim 1; and an attitude control unit which controls an attitude, based on a detection signal outputted from the inertial sensor.

14. A vehicle comprising:

the inertial sensor according to claim 3; and an attitude control unit which controls an attitude, based on a detection signal outputted from the inertial sensor.

15. The vehicle according to claim 13, further comprising at least one system from among an engine system, a braking system, and a keyless entry system, wherein the attitude control unit controls the at least one system among the engine system, the braking system, and the keyless entry system, based on the detection signal.

\* \* \* \* \*